(12) United States Patent
Walker

(10) Patent No.: US 10,049,727 B2
(45) Date of Patent: Aug. 14, 2018

(54) SEMICONDUCTOR DEVICES, CIRCUITS AND METHODS FOR READ AND/OR WRITE ASSIST OF AN SRAM CIRCUIT PORTION BASED ON VOLTAGE DETECTION AND/OR TEMPERATURE DETECTION CIRCUITS

(71) Applicant: Darryl G. Walker, San Jose, CA (US)

(72) Inventor: Darryl G. Walker, San Jose, CA (US)

( * ) Notice: Subject to any disclaimer, the term of this patent is extended or adjusted under 35 U.S.C. 154(b) by 0 days.

(21) Appl. No.: 15/587,938

(22) Filed: May 5, 2017

(65) Prior Publication Data

US 2017/0372776 A1    Dec. 28, 2017

Related U.S. Application Data

(60) Provisional application No. 62/353,534, filed on Jun. 22, 2016.

(51) Int. Cl.
G11C 11/419    (2006.01)
G11C 29/02    (2006.01)

(52) U.S. Cl.
CPC .......... *G11C 11/419* (2013.01); *G11C 29/028* (2013.01)

(58) Field of Classification Search
CPC ............................ G11C 11/419; G11C 29/02
USPC .......................................................... 365/154
See application file for complete search history.

(56) References Cited

U.S. PATENT DOCUMENTS

| | | |
|---|---|---|
| 5,298,816 A | 3/1994 | Kaplinsky |
| 5,764,564 A | 6/1998 | Frake et al. |
| 6,788,566 B1 | 9/2004 | Bhavnagarwala et al. |
| 6,804,143 B1 | 10/2004 | Hobson |
| 6,985,397 B2 | 1/2006 | Tokui et al. |
| 7,009,884 B2 | 3/2006 | Yaoi et al. |
| 7,038,282 B2 | 5/2006 | Tokui et al. |
| 7,203,118 B2 | 4/2007 | Yaoi et al. |
| 7,248,508 B1 | 7/2007 | Frederick |
| 7,315,603 B2 | 1/2008 | Iwase et al. |
| 7,324,368 B2 | 1/2008 | Wang et al. |
| 7,366,006 B2 | 4/2008 | Zhang |
| 7,372,758 B2 | 5/2008 | Yaoi et al. |
| 7,379,354 B2 | 5/2008 | Heinrich-Barna et al. |
| 7,400,523 B2 | 7/2008 | Houston |
| 7,502,275 B2 | 3/2009 | Nii et al. |
| 7,515,489 B2 | 4/2009 | Wong |
| 7,570,525 B2 | 8/2009 | Nii et al. |
| 7,586,806 B2 | 9/2009 | Wong |

(Continued)

OTHER PUBLICATIONS

Karl et al., A 0.6V, 1.5 GHz 84 Mb SRAM in 14 nm FinFET CMOS Technology With Capactive Charge-Sharing Write Assist Circuitry, IEEE Journal of Solid-State Circuits, vol. 51, No. 1, Jan. 2016, pp. 222-229.

(Continued)

*Primary Examiner* — Jason Lappas

(57) ABSTRACT

A semiconductor device can include a voltage detector circuit configured to generate a first potential that is essentially proportional to a first power supply potential and to provide a first and second voltage window signal by comparing the first potential to a first and second reference potential. The voltage window signals indicate voltage windows in which the first power supply potential is located. An assist control circuit receives the voltage window signals and provides at least one assist signal which can alter read or write operations to a static random access memory cell.

20 Claims, 17 Drawing Sheets

(56) References Cited

U.S. PATENT DOCUMENTS

| | | |
|---|---|---|
| 7,596,012 B1 | 9/2009 | Su et al. |
| 7,613,031 B2 | 11/2009 | Hanafi et al. |
| 7,613,050 B2 | 11/2009 | Braceras et al. |
| 7,613,052 B2 | 11/2009 | Van Winkelhoff et al. |
| 7,613,053 B2 | 11/2009 | van Winkelhoff et al. |
| 7,636,268 B1 | 12/2009 | Peng |
| 7,643,357 B2 | 1/2010 | Braceras et al. |
| 7,653,846 B2 | 1/2010 | Kim et al. |
| 7,660,150 B2 | 2/2010 | Mikan, Jr. et al. |
| 7,672,182 B2 | 3/2010 | Park et al. |
| 7,679,948 B2 | 3/2010 | Park et al. |
| 7,688,668 B2 | 3/2010 | Hold |
| 7,692,974 B2 | 4/2010 | Amirante et al. |
| 7,701,755 B2 | 4/2010 | Chen et al. |
| 7,733,686 B2 | 6/2010 | Clinton |
| 7,733,687 B2 | 6/2010 | Kengeri et al. |
| 7,738,283 B2 | 6/2010 | Wong |
| 7,742,326 B2 | 6/2010 | Houston |
| 7,817,481 B2 | 10/2010 | Adams et al. |
| 7,830,727 B2 | 11/2010 | Arsovski et al. |
| 7,835,217 B1 | 11/2010 | Su et al. |
| 7,839,704 B2 | 11/2010 | Murata |
| 7,852,661 B2 | 12/2010 | Liu |
| 7,852,700 B2 | 12/2010 | Akiyoshi |
| 7,864,600 B2 | 1/2011 | Mikan, Jr. et al. |
| 7,864,617 B2 | 1/2011 | Kenkare |
| RE42,145 E | 2/2011 | Hobson |
| 7,881,137 B2 | 2/2011 | Chen et al. |
| 7,898,875 B2 | 3/2011 | Tao et al. |
| 7,903,483 B2 | 3/2011 | Russell et al. |
| 7,924,650 B2 | 4/2011 | Cho et al. |
| 7,952,911 B2 | 5/2011 | Lee et al. |
| 7,961,500 B2 | 6/2011 | Shinozaki |
| 7,978,503 B2 | 7/2011 | Koike et al. |
| 7,978,554 B2 | 7/2011 | Kim et al. |
| 7,978,559 B2 | 7/2011 | Kim et al. |
| 7,986,571 B2 | 7/2011 | Arsovski et al. |
| 8,000,130 B2 | 8/2011 | Kushida |
| 8,004,907 B2 | 8/2011 | Russell et al. |
| 8,009,500 B2 | 8/2011 | Nii et al. |
| 8,018,788 B2 | 9/2011 | Jung et al. |
| 8,045,402 B2 | 10/2011 | Yeung |
| 8,059,482 B2 | 11/2011 | Russell et al. |
| 8,072,797 B2 | 12/2011 | Sachdev et al. |
| 8,120,975 B2 | 2/2012 | Kenkare et al. |
| 8,130,579 B2 | 3/2012 | Kumar et al. |
| 8,164,938 B2 | 4/2012 | Kuroda et al. |
| 8,164,964 B2 | 4/2012 | Chandra et al. |
| 8,218,376 B2 | 7/2012 | Seshadri et al. |
| 8,218,390 B2 | 7/2012 | Nii et al. |
| 8,233,337 B2 | 7/2012 | Arsovski et al. |
| 8,233,342 B2 | 7/2012 | Adams et al. |
| 8,243,541 B2 | 8/2012 | Cho et al. |
| 8,248,867 B2 | 8/2012 | Mikan, Jr. et al. |
| 8,259,486 B2 | 9/2012 | Kumar et al. |
| 8,279,687 B2 | 10/2012 | Adams et al. |
| 8,279,696 B2 | 10/2012 | Shinozaki |
| 8,295,099 B1 | 10/2012 | Yachareni et al. |
| 8,305,798 B2 | 11/2012 | Deng |
| 8,310,894 B1 | 11/2012 | Su et al. |
| 8,315,117 B2 | 11/2012 | Zhang et al. |
| 8,320,164 B2 | 11/2012 | Chuang et al. |
| 8,325,511 B2 | 12/2012 | Seshadri |
| 8,325,512 B2 | 12/2012 | Chuang et al. |
| 8,331,180 B2 | 12/2012 | Adams et al. |
| 8,339,876 B2 | 12/2012 | Chandra et al. |
| 8,345,504 B2 | 1/2013 | Chuang et al. |
| 8,355,276 B2 | 1/2013 | Idgunji et al. |
| 8,363,453 B2 | 1/2013 | Arsovski et al. |
| 8,363,484 B2 | 1/2013 | Chandra et al. |
| 8,379,436 B2 | 2/2013 | Kawasumi |
| 8,379,465 B2 | 2/2013 | Clinton et al. |
| 8,400,804 B2 | 3/2013 | Tang et al. |
| 8,411,518 B2 | 4/2013 | Janardan et al. |
| 8,427,896 B1 | 4/2013 | Agarwal et al. |
| 8,432,764 B2 | 4/2013 | Heymann et al. |
| 8,437,214 B2 | 5/2013 | Mikan et al. |
| 8,441,842 B2 | 5/2013 | Rachamadugu et al. |
| 8,441,874 B2 | 5/2013 | Sinha et al. |
| 8,450,778 B2 | 5/2013 | Chang et al. |
| 8,451,652 B2 | 5/2013 | Seikh et al. |
| 8,451,670 B2 | 5/2013 | Kolar et al. |
| 8,456,939 B2 | 6/2013 | Prabhat |
| 8,462,542 B2 | 6/2013 | Deng |
| 8,462,572 B2 | 6/2013 | Sharma et al. |
| 8,467,233 B2 | 6/2013 | Yu et al. |
| 8,472,271 B2 | 6/2013 | Dawson et al. |
| 8,483,003 B2 | 7/2013 | Maeda |
| 8,488,369 B2 | 7/2013 | Chandra et al. |
| 8,488,401 B2 | 7/2013 | Sasaki et al. |
| 8,498,143 B2 | 7/2013 | Deng |
| 8,503,221 B1 | 8/2013 | Hobson et al. |
| 8,514,611 B2 | 8/2013 | Nguyen et al. |
| 8,514,612 B2 | 8/2013 | Ishii et al. |
| 8,520,429 B2 | 8/2013 | Behrends et al. |
| 8,525,546 B1 | 9/2013 | Arsovski et al. |
| 8,526,256 B2 | 9/2013 | Ghosh et al. |
| 8,559,213 B2 | 10/2013 | Yang et al. |
| 8,570,791 B2 | 10/2013 | Liu |
| 8,582,387 B1 | 11/2013 | Su et al. |
| 8,582,389 B2 | 11/2013 | Gajjewar et al. |
| 8,588,004 B2 | 11/2013 | Chand Sk et al. |
| 8,593,890 B2 | 11/2013 | Adams et al. |
| 8,611,166 B2 | 12/2013 | Shinozaki |
| 8,625,333 B2 | 1/2014 | Rao et al. |
| 8,630,132 B2 | 1/2014 | Cheng et al. |
| 8,630,142 B2 | 1/2014 | Nii et al. |
| 8,634,263 B2 | 1/2014 | Kenkare et al. |
| 8,654,575 B2 | 2/2014 | Deng |
| 8,659,936 B2 | 2/2014 | Chuang et al. |
| 8,665,637 B2 | 3/2014 | Ishikura et al. |
| 8,665,658 B2 | 3/2014 | Chen |
| 8,687,437 B2 | 4/2014 | Kim et al. |
| 8,693,235 B2 | 4/2014 | Liaw |
| 8,693,237 B2 | 4/2014 | Jou et al. |
| 8,693,267 B2 | 4/2014 | Gupta et al. |
| 8,711,641 B2 | 4/2014 | Sim et al. |
| 8,724,373 B2 | 5/2014 | Garg et al. |
| 8,724,420 B2 | 5/2014 | Cheng et al. |
| 8,730,712 B2 | 5/2014 | Choi |
| 8,730,713 B2 | 5/2014 | Garg et al. |
| 8,743,581 B2 | 6/2014 | Tang et al. |
| 8,743,645 B2 | 6/2014 | Nii et al. |
| 8,755,239 B2 | 6/2014 | Holla et al. |
| 8,773,918 B2 | 7/2014 | Tanabe |
| 8,773,923 B2 | 7/2014 | Chen et al. |
| 8,773,924 B2 | 7/2014 | Roy et al. |
| 8,773,940 B2 | 7/2014 | Badrudduza |
| 8,804,406 B2 | 8/2014 | Rachamadugu et al. |
| 8,830,783 B2 | 9/2014 | Idgunji et al. |
| 8,848,461 B2 | 9/2014 | Chang et al. |
| 8,854,869 B2 | 10/2014 | Komatsu et al. |
| 8,861,290 B2 | 10/2014 | Zimmer et al. |
| 8,885,393 B2 | 11/2014 | Bhatia et al. |
| 8,885,429 B1 | 11/2014 | Van Winkelhoff et al. |
| 8,908,418 B2 | 12/2014 | Yabuuchi |
| 8,908,421 B2 | 12/2014 | Liaw |
| 8,913,456 B2 | 12/2014 | Badrudduza et al. |
| 8,923,078 B2 | 12/2014 | Lin et al. |
| 8,934,313 B2 | 1/2015 | Song et al. |
| 8,937,832 B2 | 1/2015 | Kitagawa et al. |
| 8,947,951 B2 | 2/2015 | Baeck et al. |
| 8,953,401 B2 | 2/2015 | Chen |
| 8,958,232 B2 | 2/2015 | Chang et al. |
| 8,958,237 B1 | 2/2015 | Yang et al. |
| 8,958,238 B2 | 2/2015 | Sharma et al. |
| 8,964,452 B2 | 2/2015 | Su et al. |
| 8,964,455 B2 | 2/2015 | Liaw |
| 8,964,490 B2 | 2/2015 | Chow et al. |
| 8,971,096 B2 | 3/2015 | Jung et al. |
| 8,971,097 B2 | 3/2015 | Ngo et al. |
| 8,976,574 B2 | 3/2015 | Ahmed et al. |
| 8,982,651 B2 | 3/2015 | Grover et al. |
| 8,988,949 B2 | 3/2015 | Hua et al. |

(56) References Cited

U.S. PATENT DOCUMENTS

| | | |
|---|---|---|
| 8,995,208 B2 | 3/2015 | Jung et al. |
| 9,007,815 B2 | 4/2015 | Liaw |
| 9,013,949 B2 | 4/2015 | Schreiber et al. |
| 9,019,751 B2 | 4/2015 | Jin et al. |
| 9,030,863 B2 | 5/2015 | Gulati et al. |
| 9,030,886 B2 | 5/2015 | Chen |
| 9,030,893 B2 | 5/2015 | Jung et al. |
| 9,036,427 B2 | 5/2015 | Van Winkelhoff et al. |
| 9,047,980 B2 | 6/2015 | Agarwal et al. |
| 9,053,975 B2 | 6/2015 | Komatsu et al. |
| 9,058,861 B2 | 6/2015 | Behrends et al. |
| 9,064,550 B2 | 6/2015 | Chang et al. |
| 9,070,432 B2 | 6/2015 | Hsieh et al. |
| 9,082,507 B2 | 7/2015 | Holla et al. |
| 9,087,607 B2 | 7/2015 | Adams et al. |
| 9,093,125 B2 | 7/2015 | Puckett et al. |
| 9,093,148 B2 | 7/2015 | Hatsuda |
| 9,093,176 B2 | 7/2015 | Wu et al. |
| 9,105,315 B2 | 8/2015 | Hold et al. |
| 9,105,326 B2 | 8/2015 | Chen et al. |
| 9,111,635 B2 | 8/2015 | Jung et al. |
| 9,117,510 B2 | 8/2015 | Yang et al. |
| 9,123,439 B2 | 9/2015 | Pilo |
| 9,129,707 B2 | 9/2015 | Lin et al. |
| 9,135,985 B2 | 9/2015 | Li et al. |
| 9,142,266 B2 | 9/2015 | Chen et al. |
| 9,153,304 B2 | 10/2015 | Kulkarni et al. |
| 9,159,415 B2 | 10/2015 | Cosemans |
| 9,172,371 B2 | 10/2015 | Arsovski et al. |
| 9,177,633 B2 | 11/2015 | Roy et al. |
| 9,183,922 B2 | 11/2015 | Yang et al. |
| 9,189,052 B2 | 11/2015 | Bhatia et al. |
| 9,202,555 B2 | 12/2015 | Jung et al. |
| 9,208,853 B2 | 12/2015 | Kolar et al. |
| 9,208,858 B1 | 12/2015 | Lin et al. |
| 9,208,860 B2 | 12/2015 | Ngo et al. |
| 9,208,900 B2 | 12/2015 | Sinangil et al. |
| 9,218,872 B1 | 12/2015 | Liaw |
| 9,218,873 B2 | 12/2015 | Nii et al. |
| 9,224,453 B2 | 12/2015 | Jin et al. |
| 9,224,455 B1 | 12/2015 | Seo et al. |
| 9,230,636 B2 | 1/2016 | Meinerzhagen et al. |
| 9,230,637 B1 | 1/2016 | Butt et al. |
| 9,236,113 B2 | 1/2016 | Holla et al. |
| 9,236,116 B1 | 1/2016 | Braceras et al. |
| 9,245,595 B2 | 1/2016 | Felix et al. |
| 9,245,602 B2 | 1/2016 | Joshi |
| 9,251,875 B1 | 2/2016 | Atallah et al. |
| 9,263,119 B2 | 2/2016 | Kobatake |
| 9,263,121 B2 | 2/2016 | Karl et al. |
| 9,269,424 B2 | 2/2016 | Kim et al. |
| 9,281,030 B2 | 3/2016 | Dubey et al. |
| 9,281,031 B2 | 3/2016 | Chang et al. |
| 9,281,311 B2 | 3/2016 | Wu et al. |
| 9,286,969 B2 | 3/2016 | Agarwal et al. |
| 9,293,192 B1 | 3/2016 | Wong |
| 9,299,395 B2 | 3/2016 | Kulkarni et al. |
| 9,299,418 B2 | 3/2016 | Nii et al. |
| 9,299,421 B1 | 3/2016 | Lien |
| 9,305,627 B2 | 4/2016 | Hatsuda |
| 9,305,633 B2 | 4/2016 | Grover et al. |
| 9,324,392 B1 | 4/2016 | Asenov et al. |
| 9,324,413 B2 | 4/2016 | Ko et al. |
| 9,324,415 B2 | 4/2016 | Katoch |
| 9,330,751 B2 | 5/2016 | Nagle et al. |
| 9,331,098 B2 | 5/2016 | Stuber et al. |
| 9,336,861 B1 | 5/2016 | Moharir |
| 9,336,863 B2 | 5/2016 | Jung et al. |
| 9,336,865 B1 | 5/2016 | Chu et al. |
| 9,349,437 B2 | 5/2016 | Singh et al. |
| 9,349,438 B2 | 5/2016 | Sano et al. |
| 9,355,694 B2 | 5/2016 | Kulkarni et al. |
| 9,355,710 B2 | 5/2016 | Gong et al. |
| 9,368,194 B2 | 6/2016 | Komatsu et al. |
| 9,374,072 B2 | 6/2016 | Hold et al. |
| 9,378,788 B2 | 6/2016 | Kolar et al. |
| 9,396,790 B1 | 7/2016 | Chhabra et al. |
| 9,396,795 B1 | 7/2016 | Jeloka et al. |
| 9,411,391 B2 | 8/2016 | Bhatia et al. |
| 9,411,392 B2 | 8/2016 | Bhatia et al. |
| 9,418,759 B2 | 8/2016 | Badereddine et al. |
| 9,424,910 B2 | 8/2016 | Yabuuchi |
| 9,431,096 B1 | 8/2016 | Fritsch et al. |
| 9,437,281 B2 | 9/2016 | Hsieh et al. |
| 9,449,656 B2 | 9/2016 | Huang et al. |
| 9,449,661 B2 | 9/2016 | Chen et al. |
| 9,449,663 B2 | 9/2016 | Yang et al. |
| 9,449,669 B2 | 9/2016 | Luan et al. |
| 9,449,680 B2 | 9/2016 | Huang |
| 9,455,022 B2 | 9/2016 | Yabuuchi et al. |
| 9,455,025 B2 | 9/2016 | Wu et al. |
| 9,455,028 B1 | 9/2016 | Sahu |
| 9,460,771 B2 | 10/2016 | Luan et al. |
| 9,460,776 B2 | 10/2016 | Dally |
| 9,466,536 B2 | 10/2016 | Goktepeli et al. |
| 9,478,507 B2 | 10/2016 | Stuber |
| 9,484,096 B1 | 11/2016 | Chen et al. |
| 9,490,007 B1 | 11/2016 | Chan et al. |
| 9,490,008 B1 | 11/2016 | Moharir |
| 9,490,760 B2 | 11/2016 | Wang et al. |
| 9,496,020 B2 | 11/2016 | Luan et al. |
| 9,496,025 B2 | 11/2016 | Chandra et al. |
| 9,496,027 B2 | 11/2016 | Rim et al. |
| 9,496,028 B2 | 11/2016 | Nii et al. |
| 9,508,414 B2 | 11/2016 | Riley |
| 9,508,420 B1 | 11/2016 | Hunt-Schroeder et al. |
| 9,508,729 B2 | 11/2016 | Liaw |
| 9,530,796 B2 | 12/2016 | Stuber et al. |
| 9,542,992 B2 | 1/2017 | Lin et al. |
| 9,542,998 B1 | 1/2017 | Akhilesh et al. |
| 9,548,090 B2 | 1/2017 | Arita et al. |
| 9,548,104 B1 | 1/2017 | Braceras et al. |
| 9,548,106 B2 | 1/2017 | Sano et al. |
| 9,564,198 B2 | 2/2017 | Luan et al. |
| 9,564,211 B2 | 2/2017 | Liaw |
| 9,564,441 B2 | 2/2017 | Luan et al. |
| 9,570,156 B1 | 2/2017 | Braceras et al. |
| 9,576,623 B2 | 2/2017 | Jung et al. |
| 9,576,644 B2 | 2/2017 | Liaw |
| 9,576,646 B2 | 2/2017 | Wong |
| 9,583,178 B2 | 2/2017 | Jung et al. |
| 9,583,180 B2 | 2/2017 | Holst |
| 2016/0042784 A1* | 2/2016 | Rim .............. G11C 11/419 365/154 |

OTHER PUBLICATIONS

Keane et al., 5.6Mb/mm2 1R1W 8T SRAM Arrays Operating down to 560mV Utilizing Small-Signal Sensing with Charge-Shared Bitline Asymmetric Sense Amplifier in 14nm FinFET CMOS Technology, 2016 IEEE International Solid-State Circuits Conference, Feb. 3, 2016, pp. 308-310.

Qazi et al., Challenges and Directions for Low-Voltage SRAM, IEEE Design & Test of Computers, Jan./Feb. 2011, pp. 32-43.

Sinangil et al., A 28 nm 2 Mbit 6 T SRAM With Highly Configurable Low-Voltage Write-Ability Assist Implementation and Capacitor-Based Sense-Amplifier Input Offset Compensation, IEEE Journal of Solid-State Circuits, vol. 51, No. 2, Feb. 2016, pp. 557-567.

Song et al., A 14nm FinFET 128Mb 6T SRAM with Vmin-Enhancement Techniques for Low-Power Applications, 2014 IEEE International Solid-State Circuits Conference, Feb. 11, 2014, pp. 232-233.

Ueda et al., Ultra-Low Voltage (0.1V) Operation of Vth Self-Adjusting MOSFET and SRAM Cell, 2014 Symposium on VLSI Technology Digest of Technical Papers, 2014.

Yabuuchi et al., 20nm High-Density Single-Port and Dual-Port SRAMs with Wordline-Voltage-Adjustment System for Read/Write Assists, 2014 IEEE International Solid-State Circuits Conference, Feb. 11, 2014, pp. 234-235.

(56) References Cited

OTHER PUBLICATIONS

ISA/US USPTO, International Search Report for PCT Application No. PCT/US2017/038395, dated Sep. 8, 2017.
ISA/US USPTO, Written Opinion of the International Search Authority for PCT Application No. PCT/US2017/038395, dated Sep. 8, 2017.
Office Action dated Nov. 2, 2017, for U.S. Appl. No. 15/587,901.

* cited by examiner

Operational States of Word Line Voltage Circuit

| Write | Read | WLH | WLL | VWL |
|---|---|---|---|---|
| 0 | 0 | X | X | VDD |
| X | X | 0 | 0 | VDD |
| 0 | X | 1 | 0 | VDD |
| 1 | 0 | 1 | 0 | VWLH |
| X | 0 | 0 | 1 | VDD |
| 0 | 1 | 0 | 1 | VWLL |
| 1 | 0 | 1 | 1 | VWLH |
| 0 | 1 | 1 | 1 | VWLL |

SEMICONDUCTOR DEVICES, CIRCUITS AND METHODS FOR READ AND/OR WRITE ASSIST OF AN SRAM CIRCUIT PORTION BASED ON VOLTAGE DETECTION AND/OR TEMPERATURE DETECTION CIRCUITS

RELATED APPLICATIONS

This application claims the benefit of U.S. Provisional Patent Application Ser. No. 62/353,534 filed Jun. 22, 2016, the contents of which are incorporated by reference herein.

TECHNICAL FIELD

The present invention relates generally to a semiconductor device, and more particularly to improving efficient and reliable operation at low voltages of an SRAM semiconductor device.

BACKGROUND OF THE INVENTION

A static random access memory (SRAM) device may have difficulty writing data and reading data over a wide range of operating conditions without destroying data stored in the SRAM cell.

In light of the above, it would be desirable to provide a method of reliably reading and writing data to and from an SRAM memory cell over a wide range of operating conditions including different temperatures and/or power supply voltage levels.

DETAILED DESCRIPTION OF THE EMBODIMENTS

According to the embodiments set forth below, a semiconductor device including static random access memory (SRAM) may include a voltage level detection circuit that may indicate a voltage window in which the device is operating and/or a temperature detection circuit that may indicate a temperature window in which the device is operating. Based on the voltage window and/or the temperature window, various write and read assist circuits may be activated or deactivated. In this way, the device may operate at a broader range of voltages and/or temperatures without affecting access times and/or power dissipation unnecessarily while still maintaining data integrity. The semiconductor device may include a processor circuit with on die SRAM.

Figure 1:
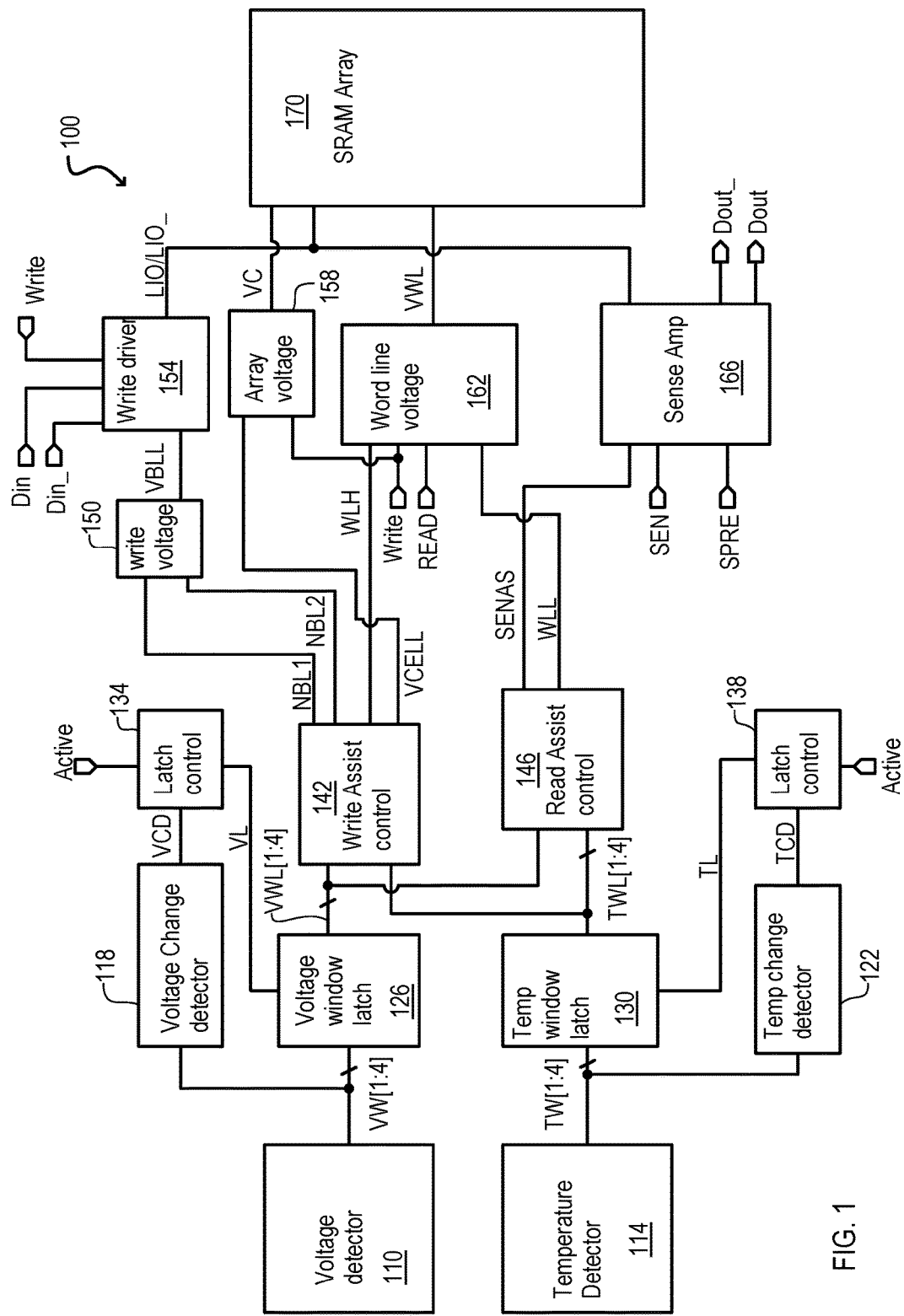
FIG. 1 is a block schematic diagram of semiconductor device including SRAM circuitry according to an embodiment.

Referring now to FIG. 1, a semiconductor device including SRAM circuitry according to an embodiment is set forth in a block schematic diagram and given the general reference character 100.

Semiconductor device 100 may include a voltage detector circuit 110, a temperature detector circuit 114, a voltage window change detector circuit 118, a temperature window change detector circuit 122, a voltage window latch circuit 126, a temperature window latch circuit 130, a voltage latch control circuit 134, a temperature latch control circuit 138, a write assist control circuit 142, a read assist control circuit 146, a write voltage circuit 150, a write driver circuit 154, an array cell voltage circuit 158, a word line voltage circuit 162, a sense amplifier circuit 166, and an SRAM array 170.

Voltage detector circuit 110 may provide a voltage window signals VW[1:4] having a value (voltage window value) based on a voltage window in which power supply potential falls within. Temperature detector circuit 114 may provide a temperature window signals TW[1:4] having a value (temperature window value) based on a temperature window in which semiconductor device 100 is operating.

Voltage window change detector circuit 118 may receive voltage window signals VW[1:4] and may provide a voltage change detection signal VCD as an output. Voltage change detection signal VCD may be a pulse signal that is generated in response to the value of the voltage window signals VW[1:4] changing (i.e. in response to a transition in at least one voltage window signal VW[1:4]).

Voltage latch control circuit 134 may receive the voltage change detection signal VCD and an active signal ACTIVE and may provide a voltage latch signal VL. Active signal ACTIVE may indicate the semiconductor device 100 is in an active mode such as a read or write mode. In this case, active signal ACTIVE may be at a logic high level. When semiconductor device 100 is not in an active mode of operation, active signal ACTIVE may be at a logic low level. Voltage latch control circuit 134 may generate a voltage latch signal as a pulse signal in response to active signal ACTIVE having a logic low level if voltage change detection signal VCD has indicated a detection of a change in voltage window signals VW[1:4] (i.e. semiconductor device 100 is now operating in a different voltage window).

Voltage window latch circuit 126 may receive voltage latch signal VL and voltage window signals VW[1:4] and may provide latched voltage window signals VWL[1:4]. Voltage window latch 126 may latch voltage window signals VW[1:4] to provide latched voltage window signals VWL[1:4] in response to voltage latch signal VL.

Temperature window change detector circuit 122 may receive temperature window signals TW[1:4] and may provide a temperature change detection signal TCD as an output. Temperature change detection signal TCD may be a pulse signal that is generated in response to the value of the temperature window signals TW[1:4] changing (i.e. in response to a transition in at least one temperature window signal TW[1:4]).

Temperature latch control circuit 138 may receive the temperature change detection signal TCD and an active signal ACTIVE and may provide a temperature latch signal TL. Active signal ACTIVE may indicate the semiconductor device 100 is in an active mode such as a read or write mode. In this case, active signal ACTIVE may be at a logic high level. When semiconductor device 100 is not in an active mode of operation, active signal ACTIVE may be at a logic low level. Temperature latch control circuit 138 may generate a temperature latch signal TL as a pulse signal in response to active signal ACTIVE having a logic low level if temperature change detection signal TCD has indicated a detection of a change in temperature window signals TW[1:4] (i.e. semiconductor device 100 is now operating in a different temperature window).

Temperature window latch circuit 130 may receive temperature latch signal TL and temperature window signals TW[1:4] and may provide latched temperature window signals TWL[1:4]. Temperature window latch circuit 130 may latch temperature window signals TW[1:4] to provide latched temperature window signals TWL[1:4] in response to temperature latch signal TL.

Write assist control circuit 142 may receive latched voltage window signals VWL[1:4] and latched temperature window signals TWL[1:4] and may provide write assist control signals (NBL1, NBL2, WLH, and VCELL). Read assist control circuit 146 may receive latched voltage window signals VWL[1:4] and latched temperature window signals TWL[1:4] and may provide read assist control signals (SENAS and WLL).

Write voltage selection circuit 150 may receive write assist control signals (NBL1 and NBL2) and may provide a write potential VBLL as an output. Write voltage selection circuit 150 may provide a write potential VBLL having essentially a ground potential when both write assist control signals (NBL1 and NBL2) are at a logic low level. Write voltage selection circuit 150 may provide a write potential VBLL having a first negative potential when write assist control signal NBL1 has a logic high level. Write voltage selection circuit 150 may provide a write potential VBLL having a second negative potential when write assist control signal NBL2 has a logic high level.

Write driver 154 may receive write potential VBLL, data input signals (Din and Din_) and a write signal Write as inputs and may provide data output at local input/output lines (LIO and LIO_). Write driver 154 may provide a logic high level at a power supply potential on a first one of local input/output line (LIO or LIO_) and may provide a logic low level essentially at write potential VBBL at the other one of local input/output line (LIO or LIO_) in accordance with data received at data input signals (Din and Din_) when write signal Write is at a logic high level.

Array cell voltage circuit 158 may receive write assist control signal VCELL and write signal Write. Array cell voltage circuit 158 may provide a cell power supply potential VC to the SRAM array. Normally cell power supply potential VC may be a power supply potential (VDD), however, when write assist control signal VCELL is at a logic high and write signal Write is at a logic high level, then array cell voltage circuit 158 may provide a cell power supply potentail VC that is substantially lower than power supply voltage VDD.

Word line voltage circuit 162 may receive write assist control signal WLH, read assist control signal WLL, write signal Write, and read signal Read and may provide a word line potential VWL as an output.

Normally, word line voltage circuit 162 may provide a word line potential VWL having a power supply potential VDD. However, when write assist control signal WLH is at a logic high level and write signal Write is at a logic high level, then word line voltage circuit 162 may provide a word line potential VWL having a potential substantially higher than power supply potential VDD. When read assist control signal WLL is at a logic high level and read signal Read is at a logic high level, then word line voltage circuit 162 may provide a word line potential VWL having a potential substantially lower than power supply potential VDD.

Sense amplifier circuit 166 may receive read assist control signal SENAS, sense signal SEN, and sense precharge signal SPRE, and local input/output signals (LIO and LIO_) as inputs and may provide data output signals (Dout and Dout_) as outputs. When read assist control signal SENAS has a high logic level, then threshold compensation may be provided for sense amplifier circuit 166. When read assist control signal SENAS has a logic low level, then no threshold compensation may be provided for sense amplifier circuit 166.

SRAM array 170 may receive or provide local input/output signals (LIO and LIO_), cell voltage VC, and word line potential VWL.

SRAM array 170 may include SRAM memory cells arranged in rows (along word lines) and columns (along bit lines). SRAM array 170 may also include row decode circuitry and word line drivers that may receive word line potential VWL and column decode circuitry and column select drivers. SRAM array 170 may also include bit line equalization circuitry, none of which are illustrated in FIG. 1 to avoid unduly cluttering up the drawing.

Figures 2, 8:
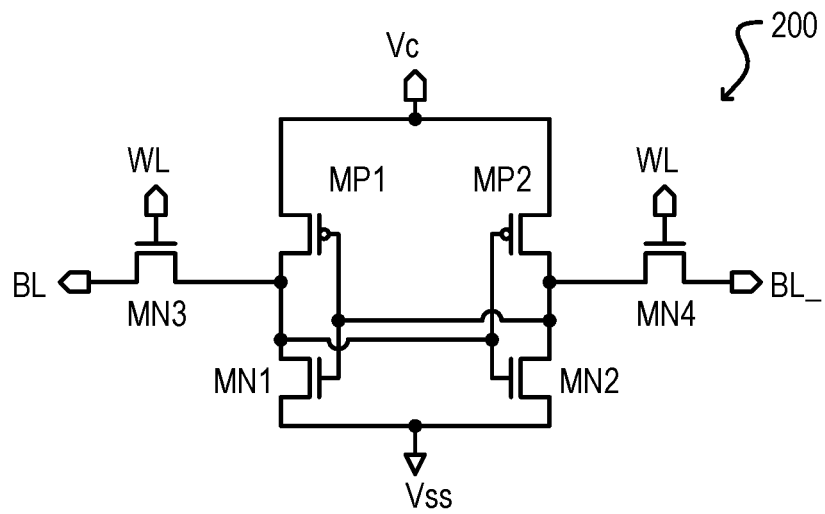
FIG. 2 is circuit schematic diagram an SRAM memory cell according to an embodiment.
FIG. 8 is a table indicating operational states of a word line voltage circuit according to an embodiment.

Referring now to FIG. 2, an SRAM memory cell is set forth in a circuit schematic diagram and given the general reference character 200. SRAM memory cell 200 can be used as memory cells in SRAM array 170 in semiconductor device 100 shown in FIG. 1.

SRAM memory cell 200 can receive a word line signal WL and can have input/output terminals connected to a bit line pair (BL and BL_). SRAM memory cell 200 can be powered by a cell power supply potential VC. SRAM memory cell 200 may include insulated gate field effect transistors (IGFETs) (MP1, MP2, MN1, MN2, MN3, and MN4).

IGFET MP1 may have receive cell power supply potential VC at a source terminal and may have a drain terminal commonly connected to a drain terminal of IGFET MN1, a source/drain terminal of IGFET MN3, and gate terminals of IGFETs (MN2 and MP2). IGFET MP1 may have a gate terminal commonly connected to a gate terminal of IGFET MN1, a source/drain terminal of IGFET MN4, and drain terminals of IGFETs (MP2 and MN2).

IGFETs (MN1 and MN2) may have source terminals connected to a ground potential Vss.

IGFET MN3 can have a source/drain terminal connected to bit line BL and a gate terminal connected to receive a word line signal WL. IGFET MN4 can have a source/drain terminal connected to bit line BL_ and a gate terminal connected to receive a word line signal WL.

SRAM memory cell 200 can operate to store data in what are essentially cross coupled inverters formed respectively by IGFETs (MP1 and MN1) and IGFETs (MP2 and MN2). The data may be read or written in response to activation of word line signal WL transitioning from a low logic level to a high logic level to turn on IGFETs (MN3 and MN4). IGFETs (MN3 and MN4) may form pass gates.

Conventionally, SRAM memory cell 200 can perform poorly at low voltages for power supply potential VC during read and/or write operations and data integrity can be compromised. However, as will be explained voltage detector circuit 110 and temperature detector circuit 114 in combination with various read and write assist circuitry can greatly improve the operation of semiconductor device 100 including the SRAM memory cell 200 shown in FIG. 2, used in SRAM array 170 shown in FIG. 1.

Figure 3:
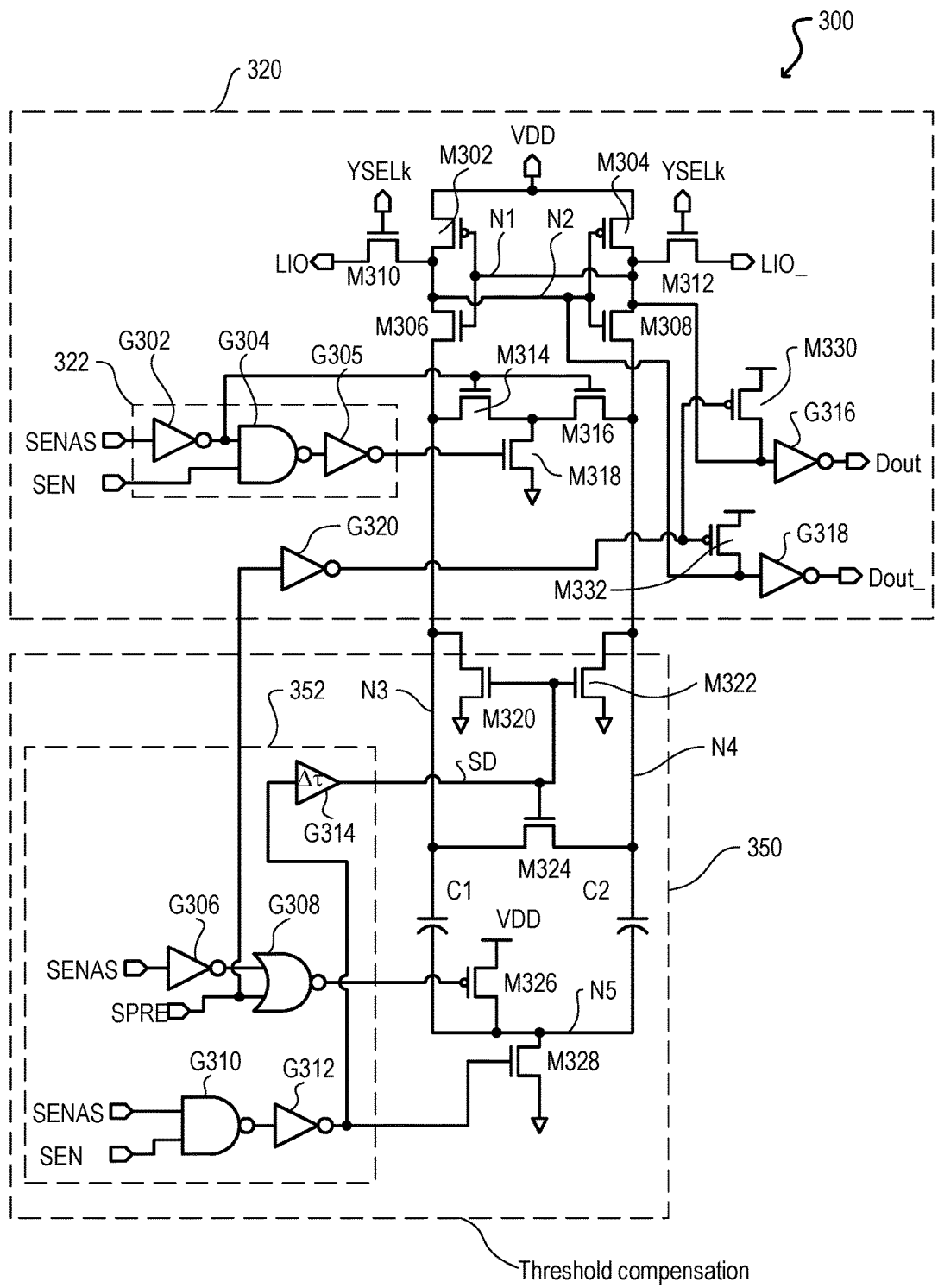
FIG. 3 is a circuit schematic diagram of a sense amplifier circuit according to an embodiment.

Referring now to FIG. 3, a sense amplifier circuit according to an embodiment is set forth in a circuit schematic diagram and given the general reference character 300. Sense amplifier circuit 300 may be used as sense amplifier circuit 166 on semiconductor device 100 of FIG. 1.

Sense amplifier circuit 300 can receive read assist control signal SENAS, sense enable signal SEN, and sense precharge signal SPRE. Sense amplifier circuit 300 may receive complementary data signals from a local input/output pair (LIO and LIO_) as selected by a column select signal YSELk that can enable pass gate devices (M310 and M312).

Sense amplifier circuit 300 may provide data signals (Dout and Dout_) as outputs. Data signals (Dout and Dout_) may be complementary.

Sense amplifier circuit 300 may include a sensing portion 320 and a threshold voltage compensation portion 350.

Sensing portion 320 may include cross-couple IGFETs (M302, M304, M306, and M308) that can be used to sense (at nodes N1 and N2) the received data. Threshold voltage compensation portion 350 may be used to compensate for threshold voltage mismatches in IGFETs (M306 and M308) in sensing portion 320.

Sensing portion 320 may include IGFETs (M302, M304, M306 M308, M310, M312, M314, M316, M318, M330, and M332), a sense control circuit 322 and logic gates (G316, G318 and G320). Logic gates (G316 and G318) may be inverters. IGFETs (M302, M304, M330, and M332) may be p-channel IGFETs. IGFETS (M306, M308, M310, M312, M314, M316, and M318) may be n-channel IGFETs.

IGFET M302 may have a source terminal connected to a supply potential VDD and a gate terminal commonly connected to a gate terminal of IGFET M306, a drain terminal of IGFET M304, a drain terminal of IGFET M308 and a drain/source terminal of pass gate (IGFET M312) at node N1. IGFET M302 may have a drain terminal commonly connected to a drain terminal of IGFET M306, a drain/source terminal of pass gate (IGFET M310), and gate terminals of IGFETs (M304 and M308) at node N2. IGFET M304 may have a source terminal connected to power supply potential VDD. Logic gate G316 may have an input terminal connected to node N1 and may provide data signal Dout at an output terminal. Logic gate G318 may have an input terminal connected to node N2 and may provide data signal Dout_ at an output terminal.

IGFET M314 may have a source/drain terminal connected to a source of IGFET M306 and another source/drain terminal connected to a drain terminal of IGFET M318 and a source/drain terminal of IGFET M316. IGFET M316 may have another source/drain terminal connected to a source of IGFET M308. IGFETs (M316 and M318) may have gate terminals connected to receive an output of logic gate G302 in sense control circuit 322. IGFET M318 may have a source terminal connected to a ground potential and a gate terminal connected to receive an output of sense control circuit 322.

Logic gate G320 may receive sense precharge signal at an input terminal and may provide an output at an output terminal. IGFET M330 may have a source terminal connected to power supply potential VDD, a drain terminal connected to node N1, and a gate terminal connected to receive the output of logic gate G320. IGFET M332 may have a source terminal connected to power supply potential VDD, a drain terminal connected to node N2, and a gate terminal connected to receive the output of logic gate G320. IGFETs (M330 and M332) may be precharge circuits for precharging nodes (N1 and N2), respectively, to a power supply potential VDD.

Sense control circuit 322 may receive read assist control signal SENAS and sense enable signal SEN as inputs and may provide an output signal to a gate terminal of IGFET M318. Sense control signal may include logic gates (G302, G304, and G305).

Logic gate G302 may receive read assist control signal SENAS at an input terminal and may provide an output at an output terminal. Logic gate G302 may be an inverter logic gate. Logic gate G304 may receive the output of logic gate G302 at a first input terminal and may receive sense enable signal SEN at a second input terminal. Logic gate G304 may provide an output at an output terminal. Logic gate G304 may be a NAND logic gate. Logic gate G305 may receive the output of logic gate G304 at an input terminal and may provide an output at an output terminal. The output of logic gate G305 may be received by the gate terminal of IGFET M318. Logic gate G305 may be an inverter.

Threshold voltage compensation circuit 350 may include capacitors (C1 and C2), IGFETs (M320, M322, M324, M326, M328), and a compensation control circuit 352. IGFETs (M320, M322, M324, and M328) may be n-channel IGFETs. IGFET M326 may be a p-channel IGFET.

Compensation control circuit 352 can receive read assist control signal SENAS, sense enable signal SEN, and sense precharge signal SPRE as inputs and may provide compensation control signals at outputs.

Compensation control circuit 352 can include logic gates (G306, G308, G310, G312, and G314). Logic gate G306 may be an inverter circuit. Logic gate G308 may be a NOR gate circuit. Logic gate G310 may be a NAND gate circuit. Logic gate G312 may be an inverter circuit. Logic gate G314 may be a delay circuit with a predetermined delay to a rising edge signal.

Logic gate G306 may receive read assist control signal SENAS at an input terminal and may provide an output at an output terminal that is received at an input terminal of logic gate G308. Logic gate G308 may have another input terminal that receives sense precharge signal SPRE and may provide an output at an output terminal. The output of logic gate G308 may be received at a gate terminal of IGFET M326.

Logic gate G310 may receive read assist control signal SENAS at an input terminal and may receive sense enable signal SEN at another input terminal. Logic gate G310 may provide an output at an output terminal. Logic gate G312 may receive the output of logic gate G310 and provide an output at an output terminal. Logic gate G314 may receive the output of logic gate G312 at an input terminal and may provide an output (delayed sense signal SD) at an output terminal.

IGFET M320 may have a drain terminal connected to node N3, a source terminal connected to receive ground potential and a gate terminal connected to receive the output of logic gate G314. IGFET M322 may have a drain terminal connected to node N4, a source terminal connected to receive ground potential and a gate terminal connected to receive the output of logic gate G314. IGFET M324 can have a first source/drain terminal connected to node N3, a second source/drain terminal connected to node N4, and a gate terminal connected to receive the output of logic gate G314. Capacitor C1 may have a first capacitor terminal connected node N3, and a second capacitor terminal connected to node N5. Capacitor C2 may have a first capacitor terminal connected node N4 and a second capacitor terminal connected to node N5. IGFET M326 can have a source terminal connected to receive a power supply potential VDD and a drain terminal connected to node N5. IGFET M326 may receive the output of logic gate G308 at a gate terminal. IGFET M328 may have a drain terminal connected to node N5 and a source terminal connected to a ground potential. IGFET M328 may receive the output of logic gate G312 at a gate terminal.

The operation of sense amplifier circuit 300 will now be explained with reference to FIGS. 4A and 4B in conjunction with FIG. 3.

Figure 4A:
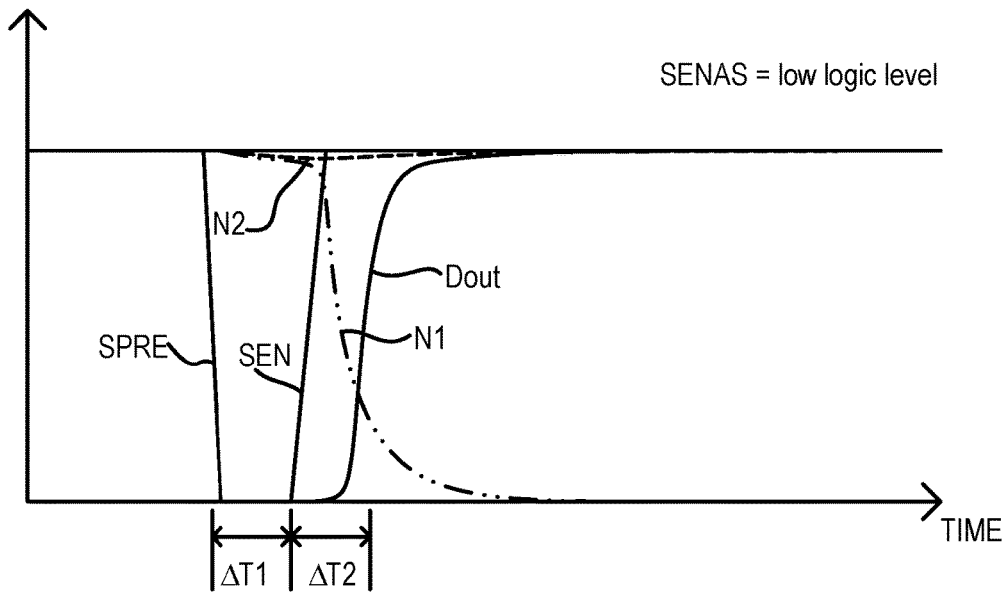
FIG. 4A is waveform diagram illustrating various signals of a sense amplifier circuit according to an embodiment.

FIG. 4A is a waveform diagram illustrating various signals of sense amplifier circuit 300 when read assist control signal SENAS has a low logic level.

Figure 4B:
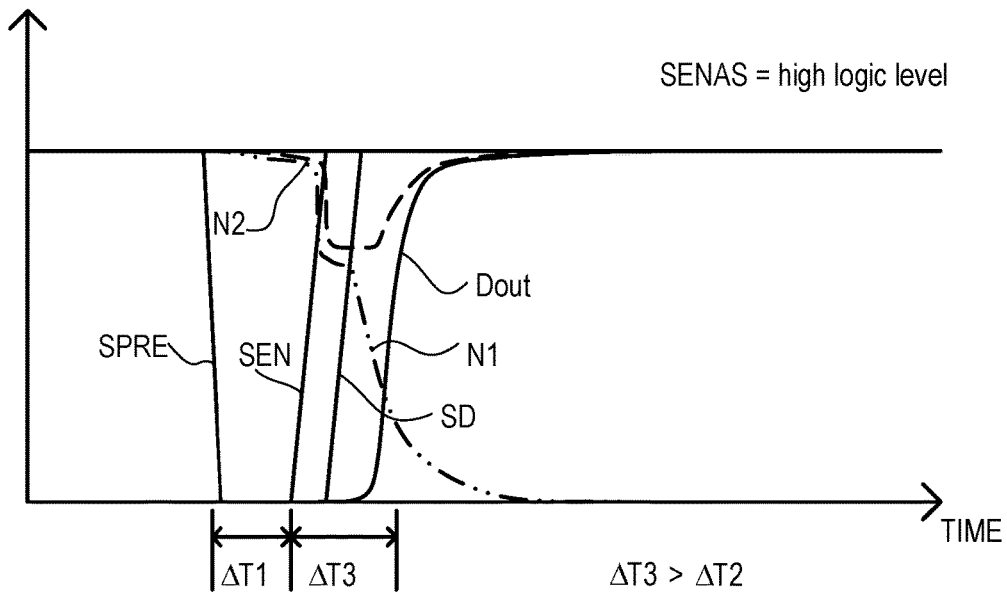
FIG. 4B is waveform diagram illustrating various signals of a sense amplifier circuit according to an embodiment.

FIG. 4B is a waveform diagram illustrating various signals of sense amplifier circuit 300 when read assist control signal SENAS has a high logic level.

First the operation of sense amplifier circuit 300 when read assist control signal SENAS has a low logic level will be explained with reference to FIG. 4A in conjunction with FIG. 3. When read assist control signal SENAS has a low logic level, the threshold compensation circuit 350 may be disabled. In particular, with read assist control signal SENAS at a low logic level, the output of logic gate G306 may be a high logic level. With the output of logic gate G306 at a high logic level, the output of logic gate G308 may be at a low logic level. When IGFET M326 receiving a low logic level, IGFET M326 may be turned on to provide a low impedance path between power supply potential VDD and node N5. In this way, the lower terminal of capacitors (C1 and C2) may be charged to power supply potential VDD.

Also, with read assist control signal SENAS at a low logic level, the output of logic gate G310 may be a high logic level and the output of logic gates (G312 and G314) may both be logic low levels. In this way, IGFETs (M320, M322, M324, and M328) may all be turned off and may have high impedance paths between their respective drain terminals and source terminals. Threshold compensation circuit 350 may remain in this operating condition during the entirety of read assist control signal SENAS remaining at a low logic level.

Also, with read assist control signal SENAS at a low logic level, logic gate G302 may provide an output having a high logic level. In this way, IGFETs (M314 and M315) may be turned on to provide respective low impedance paths between node N3 and the drain of IGFET M318 and between node N4 and the drain of IGFET M318. In other words, nodes (N3 and N4) may be electrically connected commonly to the drain of IGFET M318.

Before data is transferred from a memory cell (such as SRAM memory cell 200 in FIG. 2), to a bit line pair (BL and BL_), then to a local input/output line pair (LIO and LIO_), sense precharge signal SPRE may be at a high logic level and sense enable signal SEN may be at a low logic level (i.e. a precharge condition). With sense precharge signal SPRE at a high logic level, the output of logic gate G320 may be at a low logic level and IGFETs (M330 and M332) in sensing portion 320 may be turned on and respective low impedance paths may be provided between power supply potential VDD and node N1 and power supply potential VDD and node N2. In this way, nodes (N1 and N2) may be precharged to the power supply potential VDD.

When a read operation commences, sense precharge signal SPRE may transition to a low logic level. When sense precharge signal SPRE transitions from a high logic level to a low logic level, the output of logic gate G320 may transition to a high logic level. In this way, IGFETs (M330 and M332) may be turned off to provide a high impedance paths, respectively, between node N1 and power supply potential VDD and node N2 and power supply potential VDD.

After sense precharge signal SPRE transitions to a logic low level, nodes (N1 and N2) may receive data signals from a selected SRAM memory cell by way of selected bit lines (BL and BL_) and selected local input/output line pairs (LIO and LIO_) as selected by row and column addresses. In the particular example illustrated in FIG. 4A, the data stored in the selected SRAM memory cell is a one "1".

A predetermined time period ΔT1 after sense precharge signal SPRE transitions to a logic low level and nodes (N1 and N2) have separated enough for data to be reliably sensed, sense enable signal SEN may transition from a low logic level to a high logic level. The output of logic gate G304 may transition to a low logic level and the output of logic gate G305 may transition to a high logic level. IGFET M318 may turn on in response to these transitions and provide a low impedance path between nodes (N3 and N4) by way of IGFETs (M314 and M316) being tuned on. This allows the sense amp latch formed by IGFETs (M302, M304, M306, and M308) to sense and latch data at nodes (N2 and N1). This is illustrated by node N1 transitioning to a low logic level in FIG. 4A. In response to the transition of node N1, data out signal Dout may transition to a high logic level. It is noted that the data out signal Dout transitions ΔT2 after sense enable signal SEN transitions.

At a predetermined time later, sense enable signal SEN may transition to a low logic level and sense precharge signal SPRE may transition to a high logic level to put sense amplifier circuit 300 back in a precharge condition or state of operation.

The operation of sense amplifier circuit 300 when read assist control signal SENAS has a high logic level will be explained with reference to FIG. 4B in conjunction with FIG. 3.

Read assist control signal SENAS may have a high logic level when the power supply potential VDD is at a level and/or the temperature of semiconductor device 100 is at a level such that sense amplifier 300 may need threshold voltage compensation so that a smaller signal may be accurately sensed.

When read assist control signal SENAS has a high logic level, logic gate G302 in sense control circuit 322 may provide a low logic output. With the gate terminals of IGFETs (M314 and M316) at a low logic level, IGFETs (M314 and M316) may each provide a high impedance path between nodes (N1 and N2) and the drain terminal of IGFET M318. With a low logic level received at an input terminal, logic gate G304 may provide a logic high output and logic gate G305 may provide a low logic level at an output. With a low logic level at the gate terminal, IGFET M318 may be turned off and provide a high impedance path between source and drain terminals. In this way, when read assist control signal SENAS has a high logic level, sense control circuit 322 may disable the normal sense amplifier activation circuit comprising IGFETs (M314, M316, and M318).

Also, when read assist control signal SENAS is at a high logic level, the output of logic gate G306 may be at a low logic level and logic gate G308 may be enabled. With read assist control signal SENAS at a high logic level, logic gate G310 may be enabled. In this way, compensation control circuit 352 may be enabled to provide control signals for the operation of threshold compensation circuit 350.

Before data is transferred from a memory cell (such as SRAM memory cell 200 in FIG. 2), to a bit line pair (BL and BL_), then to a local input/output line pair (LIO and LIO_), sense precharge signal SPRE may be at a high logic level and sense enable signal SEN may be at a low logic level (i.e. a precharge condition). With sense precharge signal SPRE at a high logic level, the output of logic gate G320 may be at a low logic level and IGFETs (M330 and M332) in sensing portion 320 may be turned on and respective low impedance paths may be provided between power supply potential VDD and node N1 and power supply potential VDD and node N2. In this way, nodes (N1 and N2) may be precharged to the power supply potential VDD. Also, at this time, logic gate G308 may provide a low logic level output such that IGFET M326 may be turned on to provide a low impedance path between power supply potential VDD and node N5 to precharge node N5 to a power supply potential VDD. With sense enable signal SEN at a low logic level, logic gate G310 may provide an output having a high logic level and logic gate G312 may provide an output having a low logic level. In this way, IGFET M328 may be turned off.

With nodes (N1 and N2) precharged to a power supply potential VDD, node N3 may approach a potential of the power supply potential VDD minus the threshold voltage of IGFET M306 and node N4 may approach a potential of the power supply potential VDD minus the threshold voltage of IGFET M308. In this way, as soon as the source terminal of a respective IGFET (M306 and M308) drops (as will be explained below), the respective IGFET (M306 and M308) may begin to conduct to sense the differential data applied to compensate for threshold voltage mismatches and improve data integrity.

When a read operation commences, sense precharge signal SPRE may transition to a low logic level. When sense precharge signal SPRE transitions from a high logic level to a low logic level, the output of logic gate G320 may transition to a high logic level. In this way, IGFETs (M330 and M332) may be turned off to provide [a] high impedance paths, respectively, between node N1 and power supply potential VDD and node N2 and power supply potential VDD. With read assist control signal SENAS at a high logic level and sense precharge signal SPRE at a low logic level, the output of logic gate G308 may transition to a high logic level, thereby turning off IGFET M326 to allow node N5 to float at essentially a power supply potential VDD.

After sense precharge signal SPRE transitions to a logic low level, nodes (N1 and N2) may receive data signals from a selected SRAM memory cell by way of selected bit lines (BL and BL_) and selected local input/output line pairs (LIO and LIO_) as selected by row and column addresses. In the particular example illustrated in FIG. 4B, the data stored in the selected SRAM memory cell is a one "1". Because the semiconductor device 100 may be operating at lower power supply potential and/or extreme temperatures, the data signal at nodes (N2 and N1) may not provide as large of a differential potential as in the operation illustrated in FIG. 4A.

A predetermined time period ΔT1 after sense precharge signal SPRE transitions to a logic low level and nodes (N1 and N2) have separated enough for data to be reliably sense, sense enable signal SEN may transition from a low logic level to a high logic level. The output of logic gate G310 may transition to a low logic level and the output of logic gate G312 may transition to a high logic level. IGFET M328 may turn on in response to these transitions and provide a low impedance path between node N5 and the ground potential may be formed driving a terminal of each capacitor (C1 and C2) to be pulled toward the ground potential. This allows the sense amp latch formed by IGFETs (M302, M304, M306, and M308) to partially sense and latch data at nodes (N2 and N1). This is illustrated by nodes (N1 and N2) being pulled downward and separating by a larger amount in FIG. 4B.

A delay determined by rising edge delay logic gate G314 later, the gate terminals of IGFETs (M320, M322, and M324) may transition to a high logic level and turn on. In this way, nodes (N3 and N4) may be simultaneously electrically connected together and pulled toward a ground potential and the sensing may be fully performed with larger potential differences at nodes (N1 and N2) (i.e. sense nodes). This is illustrated by node N1 transitioning to a low logic level in FIG. 4B. In response to the transition of node N1, data out signal Dout may transition to a high logic level. It is noted that the data out signal Dout transitions ΔT3 after sense enable signal SEN transitions.

At a predetermined time later, sense enable signal SEN may transition to a low logic level and sense precharge signal SPRE may transition to a high logic level to put sense amplifier circuit 300 back in a precharge condition or state of operation.

It is noted, that ΔT3>ΔT2, indicating that the sense time is increased when threshold compensation circuit 350 is activated to delay the data from being output. For this reason, it may be desirable to only active the threshold compensation circuit 350 in sense amplifier circuit 300 when conditions (power supply potential or semiconductor device temperature) necessitate activation to improve data integrity.

Figure 5:
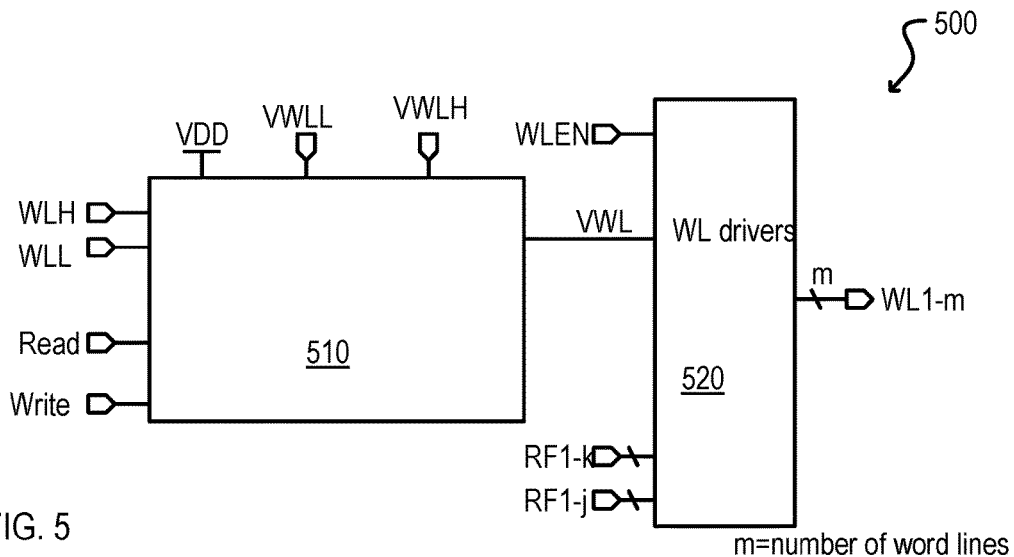
FIG. 5 is a block schematic diagram of word line generation circuitry according to an embodiment.

Referring now to FIG. 5, a block schematic diagram of word line generation circuitry according to an embodiment is set forth and given the general reference character 500. The word line generation circuitry can include a word line voltage circuit 510 and row decoders and word line drivers block 520. Word line voltage circuit 510 may be used as word line voltage circuit 162 in semiconductor device 100 of FIG. 1. Row decoders and word line drivers block 520 may be a portion of SRAM array 170 of semiconductor device 100 of FIG. 1.

Word line voltage circuit 510 may receive a write signal Write, a read signal Read, read assist control signal WLL, and write assist control signal WLH. Word line voltage circuit 510 may also receive a power supply potential VDD, a reduced power supply potential VWLL and a boosted power supply potential VWLH and may provide a word line potential VWL. Reduced power supply potential VWLL may be a potential that is substantially lower than power supply potential VDD. Boosted power supply potential VWLH may be a potential that is substantially higher than power supply potential VDD.

Row decoders and word line drivers block 520 may receive word line enable signal WLEN and row factors (RF1-j and RF1-k) as inputs. Row decoders and word line drivers block 520 can receive word line potential VWL. Row decoders and word line drivers block 520 may provide word lines WL1-m, where m is the number of rows (word lines) in SRAM array 170 of semiconductor device 100 of FIG. 1.

Figure 6:
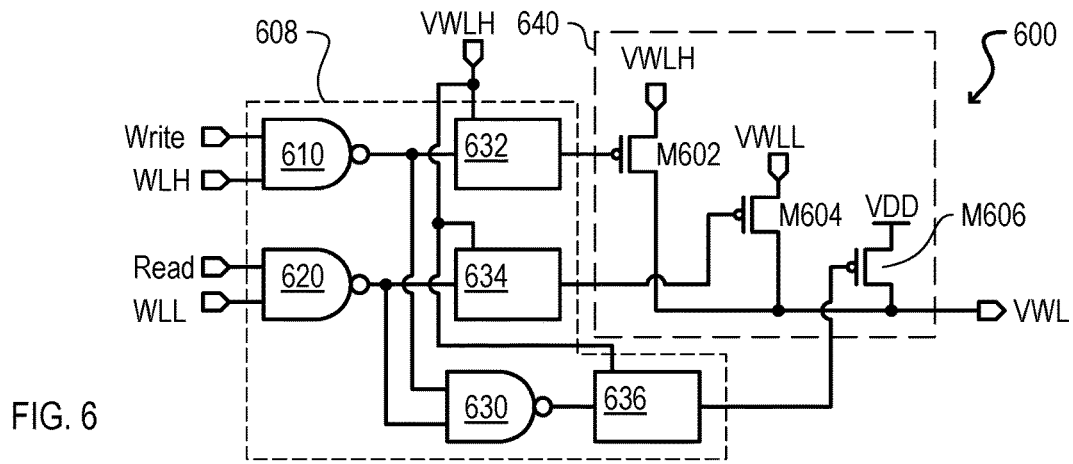
FIG. 6 is a circuit schematic diagram of a word line voltage circuit according to an embodiment.

Referring now to FIG. 6, a circuit schematic diagram of a word line voltage circuit according to an embodiment is set forth and given the general reference character 600. Word line voltage circuit 600 may be used as word line voltage circuit 510 in FIG. 5 and/or word line voltage circuit 162 in the semiconductor device 100 of FIG. 1.

Word line voltage circuit 600 may include a control circuit portion 608 including logic gates (610, 620, and 630) and voltage translator circuits (632, 634, and 636) Word line voltage circuit 600 may also include a word line potential selection portion 640 including IGFETs (M602, M604, and M606).

IGFETs (M602, M604, and M606) may each be p-channel IGFETs.

Logic gates (610, 620, and 630) may be NAND logic gates.

Logic gate 610 may receive write signal Write and write assist control signal WLH as inputs at respective input terminals and may provide an output at an output terminal. Level translator circuit 632 may receive the output of logic gate 610 and may provide a voltage translated output at an output terminal. Level translator circuit 632 may partially be powered by boosted power supply potential VWLH and may translate a potential received at a power supply potential VDD to a signal at a boosted power supply potential VWLH. Logic gate 620 may receive read signal Read and read assist control signal WLL as inputs at respective input terminals and may provide an output at an output terminal. Level translator circuit 634 may receive the output of logic gate 620 and may provide a voltage translated output at an output terminal. Level translator circuit 634 may partially be powered by boosted power supply potential VWLH and may translate a potential received at a power supply potential VDD to a signal at a boosted power supply potential VWLH. Logic gate 630 may receive the outputs of logic gates (610 and 620) at respective input terminals and may provide an output at an output terminal. Level translator circuit 636 may receive the output of logic gate 630 and may provide a voltage translated output at an output terminal. Level translator circuit 636 may partially be powered by boosted power supply potential VWLH and may translate a potential received at a power supply potential VDD to a signal at a boosted power supply potential VWLH.

IGFET M602 may have a source terminal connected to boosted power supply potential VWLH and may have a drain terminal connected to provide word line potential VWL. IGFET M602 may have a gate terminal connected to receive the output of level translator circuit 632. The output of logic gate 610 may be a boosted power supply selection signal.

IGFET M604 may have a source terminal connected to reduced power supply potential VWLL and may have a drain terminal connected to provide word line potential VWL. IGFET M604 may have a gate terminal connected to receive the output of level translator circuit 634. The output of logic gate 620 may be a reduced power supply selection signal.

IGFET M606 may have a source terminal connected to power supply potential VDD and may have a drain terminal connected to provide word line potential VWL. IGFET M606 may have a gate terminal connected to receive the output of level translator circuit 636. The output of logic gate 630 may be a normal power supply selection signal that can select the power supply potential VDD in which the semiconductor device 100 is operating to be used as a word line potential VWL.

The operation of word line voltage circuit 600 will now be explained with reference to FIG. 6 in conjunction with FIG. 1. When semiconductor device 100 (FIG. 1) is in a normal operation such that the power supply potential VDD does not have an extremely low potential and/or the temperature of the semiconductor device 100 is not at an extreme level, then write assist control circuit 142 (FIG. 1) may provide a write assist control signal WLH having a low logic level and read assist control circuit 146 (FIG. 1) may provide a read assist control signal WLL having a low logic level.

With write assist control signal WLH at a low logic level, the output of logic gate 610 may be at a high logic level. With read assist control signal WLL at a low logic level, the output of logic gate 620 may be at a high logic level. Level translator circuit 632 may receive the output of logic gate 610 having a high logic level (power supply potential VDD) and may provide an output signal having a high logic level (boosted power supply potential VWLH).

Logic gate 630 receives high logic levels at both input terminals and may provide a low logic level to an output terminal.

Because IGFET M602 receives a potential having a boosted power supply potential VWLH at a gate terminal, IGFET M602 may be turned off and may provide a high impedance between boosted power supply potential VWLH and the node providing word line potential VWL. Because IGFET M604 receives a high logic level at a gate terminal, IGFET M604 may be turned off and may provide a high impedance between reduced power supply potential VWLL and the node providing word line potential VWL. However, IGFET M606 may receive a low logic level and may be turned on. In this way, word line potential VWL may be driven to essentially a power supply potential VDD.

When the power supply potential VDD is below a predetermined potential and/or the temperature of semiconductor device 100 is in a predetermined temperature window, write assist control signal WLH may be at a high logic level.

With write assist control signal WLH at a high logic level, logic gate 610 may be enabled. In this way, when write signal Write becomes a high logic level (indicating data is to be written into a SRAM memory cell 200), the output of logic gate 610 may be at a low logic level. This low logic level may propagate through level translator circuit 632 to be received at the gate terminal of IGFET M602. IGFET M602 may be turned on to provide a low impedance path between boosted power supply potential VWLH and the node that provides word line potential VWL. In this way, word line potential may be driven toward boosted power supply potential VWLH. At the same time, with an input terminal receiving a low logic level, logic gate 630 may provide an output having a high logic level and IGFET M606 may be turned off providing a high impedance path between power supply potential VDD and the node that provides word line potential VWL.

When the power supply potential VDD is below a predetermined potential and/or the temperature of semiconductor device 100 is in a predetermined temperature window, read assist control signal WLL may be at a high logic level.

With read assist control signal WLL at a high logic level, logic gate 620 may be enabled. In this way, when read signal Read becomes a high logic level (indicating data is to be read from a SRAM memory cell 200), the output of logic gate 620 may be at a low logic level. IGFET M604 may be turned on to provide a low impedance path between reduced power supply potential VWLL and the node that provides word line potential VWL. In this way, word line potential may be driven toward reduced power supply potential VWLL. At the same time, with an input terminal receiving a low logic level, logic gate 630 may provide an output having a high logic level and IGFET M606 may be turned off providing a high impedance path between power supply potential VDD and the node that provides word line potential VWL.

Figure 7:
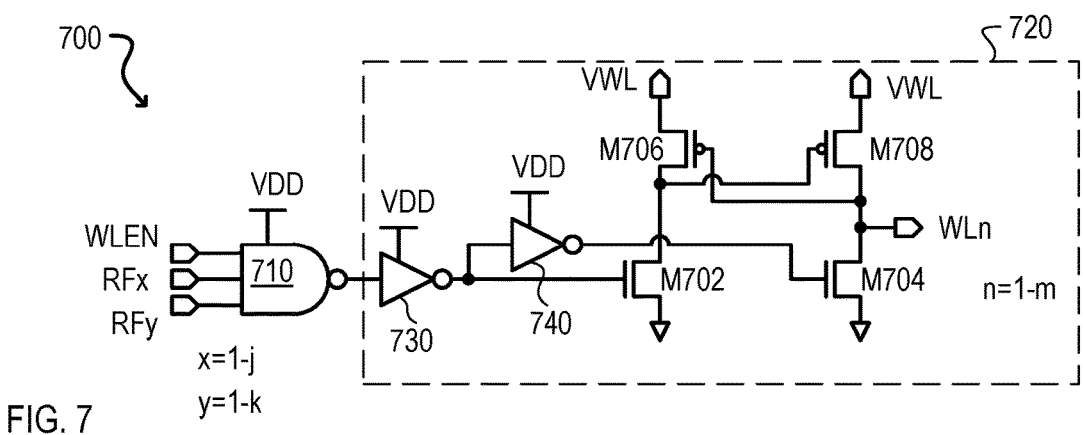
FIG. 7 is a circuit schematic diagram of a row decoder and a word line driver circuit according to an embodiment.

Referring to FIG. 7, a circuit schematic diagram of a row decoder and a word line driver circuit is set forth and given the general reference character 700.

Circuit 700 can include a row decoder circuit 710 and a word line driver circuit 720.

Row decoder circuit 710 may be a NAND logic gate and may receive a word line enable signal WLEN and row factor signals (RFx and RFy) at respective input terminals and may provide an output at an output terminal.

Word line driver circuit 720 may include logic gates (730 and 740) and IGFETs (M702, M704, M706, and M708). Logic gates (730 and 740) may each be inverter circuits. IGFETs (M702 and M704) may each be n-channel IGFETs and IGFETs (M706 and M708) may each be p-channel IGFETs.

Logic gate 730 may receive the output of row decoder circuit 710 at an input terminal and may provide an output at an output terminal. Logic gate 740 may receive the output of logic gate 730 at an input terminal and may provide an output at an output terminal. IGFET M702 may receive the output of logic gate 730 at a gate terminal. IGFET M702 may have a source terminal connected to ground potential and may have a drain terminal commonly connected to the drain terminal of IGFET M706 and the gate terminal of IGFET M708. IGFET M704 may receive the output of control gate 740 at a gate terminal. IGFET M704 may have a source terminal connected to ground potential and may have a drain terminal commonly connected to the gate terminal of IGFET M706 and the drain terminal of IGFET M708 at a word line WLn. IGFETs (M706 and M708) may have source terminals commonly connected to receive word line potential VWL.

The operation of circuit 700 will now be explained.

When word line enable signal WLEN is at a low logic level, the row decoder circuit 710 may provide an output signal having a high logic level. Logic gate 730 may provide an output having a low logic level and logic gate 740 may provide an output having a high logic level. In this way, IGFET M702 may be turned off and IGFET M704 may be turned on. With IGFET M704 turned on, word line WLn may be pulled to essentially a ground potential. With word line WLn at a low level, IGFET M706 may be turned on and the gate terminal of IGFET M708 may be pulled to the word line potential VWL and thereby turned off.

When a read or write operation is being performed, word line enable signal WLEN may transition to a high logic level. If the particular row factors (RFx and RFy) are at high logic levels (indicating a particular row address has selected a particular row decoder 720 driving a particular word line WLn), row decoder 710 may provide an output having a low logic level. Logic gate 730 may provide an output having a high logic level and logic gate 740 may provide an output having a low logic level. In this way, IGFET M702 may be turned on and IGFET M704 may be turned off. With IGFET M702 turned on, the gate of IGFET M708 may be driven toward essentially a ground potential and IGFET M708 may be turned on. With IGFET M708 turned on, word line WLn may be driven toward essentially a word line potential VWL (as provided by word line generation circuit 600). With word line WLn driven to a high level, IGFET M706 may be turned off.

Referring now to FIG. 8, a table indicating the operational states of the word line voltage circuit is set forth.

As shown in FIG. 8, when there is no read or write occurring (read signal Read and write signal Write) are at low logic levels, the word line potential VWL may essentially be at power supply potential VDD. Also, when read assist control signal WLL and write assist control signal WLH are both at low logic levels, the word line potential VWL may be essentially at a power supply potential VDD.

However, when read assist control signal WLL is at a high logic level and a read is occurring (read signal Read is at a high logic level), word line potential VWL may be essentially at a reduced power supply potential VWLL. When write assist control signal WLH is at a high logic level and a write is occurring (write signal Write is at a high logic level), word line potential VWL may be essentially at a boosted power supply potential VWLH. In all other conditions, word line potential VWL may be essentially at a power supply potential VDD.

By providing a reduced power supply potential VWLL as a word line potential VWL (driving word line WLn to that potential) during a read operation at extreme power supply potentials VDD and/or device temperatures, pass gate IGFETs (MN3 and MN4) in SRAM memory cell 200 (FIG. 2) may have a higher resistance during the read. This may prevent the data stored in SRAM memory cell 200 from flipping (i.e. changing states) when IGFETs (MP1, MP2, MN1 and MN2) are weakened. In this way, data integrity may be improved.

By providing a boosted power supply potential VWLH as a word line potential VWL (driving word line WLn to that potential) during a write operation at extreme power supply potentials VDD and/or device temperatures, pass gate IGFETs (MN3 and MN4) in SRAM memory cell 200 (FIG. 2) may have a lower resistance during the read. This may allow the old data stored in SRAM memory cell 200 to be flipped (i.e. changing states to the new data that is being written) when IGFETs (MP1, MP2, MN1 and MN2) are weakened. In this way, data integrity may be improved.

However, under normal operating conditions, the word line potential VWL may remain at power supply potential VDD and current may be reduced by eliminating the need to switch the word line potential VWL during read and write cycles, respectively.

Figure 9:
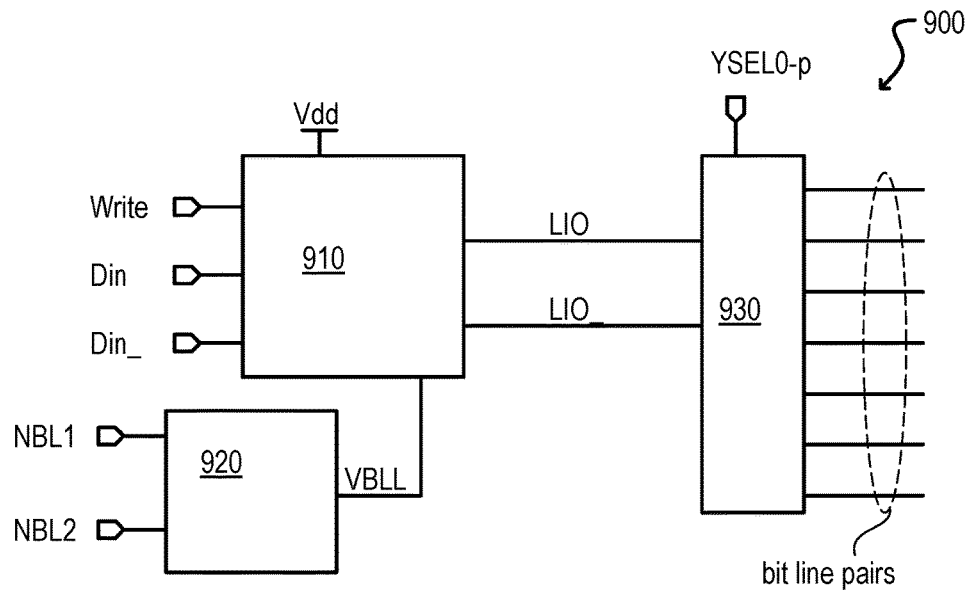
FIG. 9 a block schematic diagram of circuitry used in a write operation according to an embodiment.

Referring now to FIG. 9, circuitry used in a write operation is set forth in a block schematic diagram and given the general reference character 900.

Circuitry 900 can include a write voltage selection circuit 920, a write driver circuit 910, and column selection circuit 930. Write driver circuit 910 may be used as write driver circuit 154 in semiconductor device 100 of FIG. 1. Write voltage selection circuit 920 may be used as write voltage selection circuit 150 in semiconductor device 100 of FIG. 1.

Write voltage selection circuit 920 may receive write assist control signals (NBL1 and NBL2) as inputs at respective input terminals and may provide a write potential VBLL at an output terminal.

Write driver circuit 910 may receive a write signal Write and complementary data signals (Din and Din_) as inputs at respective input terminals. Write driver circuit 910 may also receive write potential VBLL as a write reference potential. Write driver circuit 910 may provide data signals at local input/output lines (LIO and LIO_) as output data signals to be written to an SRAM memory cell 200 (FIG. 2).

Column selection circuit 930 may receive column selection signals YSEL0-p as selection inputs. Based on which column selection signal YSEL0-p is activated, column selection circuit 930 will electrically connect the local input/output lines (LIO and LIO_) to a predetermined bit line pair to allow data to be written to a SRAM memory cell 200 connected to the predetermined bit line pair and selected by a word line (not shown).

Figure 10A:
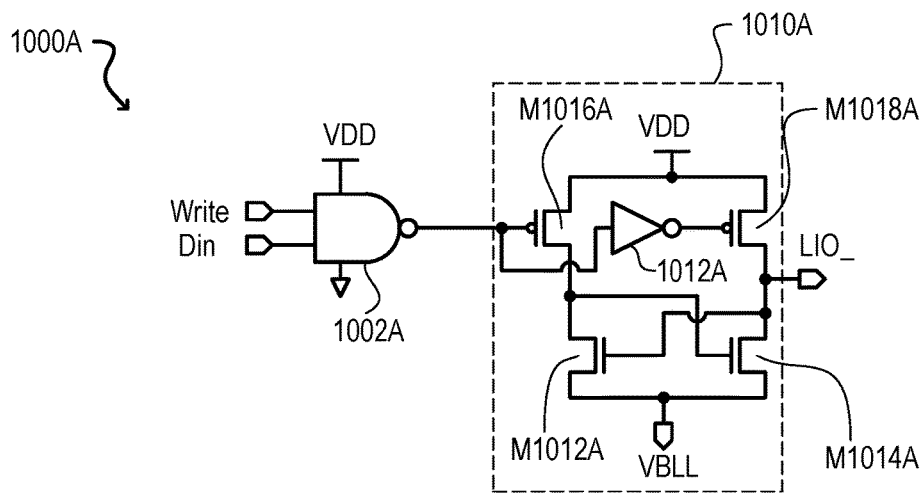
FIG. 10A is a circuit schematic diagram of a first write driver circuit according to an embodiment.

Referring now to FIG. 10A, a first write driver circuit is set forth in a circuit schematic diagram and given the general reference character 1000A.

First write driver circuit 1000A may provide a portion of write driver circuit 910 in FIG. 9 and/or a portion of write driver circuit 154 in semiconductor device 100 in FIG. 1.

First write driver circuit 1000A may include a logic gate 1002A and a level translator driver circuit 1010A. Logic gate 1002A may be a NAND logic gate.

Logic gate 1002A may receive write signal Write at one input terminal and a data signal Din at another input terminal and may provide an output at an output terminal.

Level translator driver circuit 1010A may receive the output of logic gate 1002A at an input terminal. Level translator driver circuit 1010A may receive power supply potential VDD at a first power reference terminal and write potential VBLL at a second power reference potential and may provide one of local input/output signals LIO_ at an output terminal. In particular, one of local input/output signals LIO_ may have an output swing between power supply potential, at one logic level, and write potential VBLL.

Level translator driver circuit 1010A may include IGFETs (M1012A, M1014A, M1016A, and M1018A) and a logic gate circuit 1012A. IGFETs (M1012A and M1014A) may be n-channel IGFETs. IGFETs (M1016A and M1018A) may be p-channel IGFETs.

IGFET M1012A may have a source terminal connected to receive write potential VBLL a drain terminal commonly connected to a drain terminal of IGFET M1016A and a gate terminal of IGFET M1014A. IGFET M1012A may have a gate terminal commonly connected to a drain terminal of IGFET M1014A and a drain terminal of IGFET M1018A to provide one of local input output signals LIO_. IGFET M1014A may have a source terminal connected to receive write potential VBLL. IGFET M1016A may have a gate terminal connected to receive the output of logic gate circuit 1002A and a source terminal connected to receive power supply potential VDD. Logic gate circuit 1012A may have an input terminal connected to receive the output of logic gate circuit 1002A and may provide an output at an output terminal. IGFET M1018A may have a gate terminal connected to receive the output of logic gate circuit 1012A and a source terminal connected to receive power supply potential VDD.

Figure 10B:
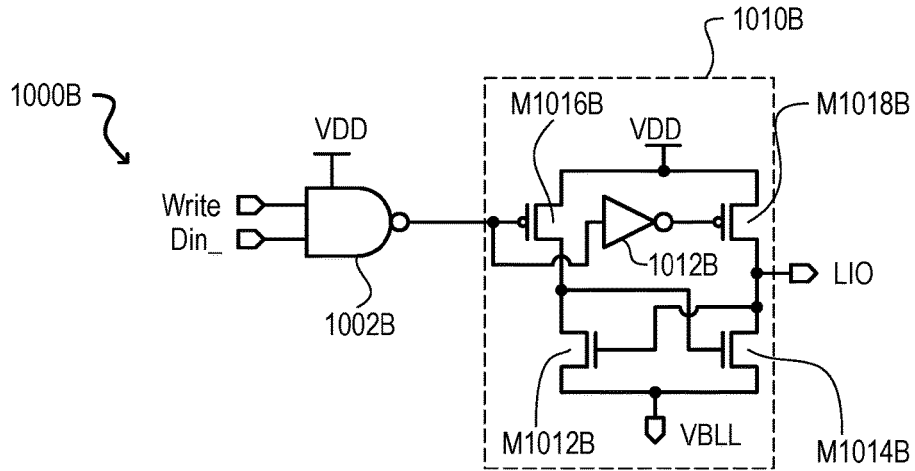
FIG. 10B is a circuit schematic diagram of a second write driver circuit according to an embodiment.

Referring now to FIG. 10B, a second write driver circuit is set forth in a circuit schematic diagram and given the general reference character 1000B.

Second write driver circuit 1000B may provide a portion of write driver circuit 910 in FIG. 9 and/or a portion of write driver circuit 154 in semiconductor device 100 in FIG. 1.

Second write driver 1000B may have essentially the same constituents as first write driver 1000A and such constituents may have the same reference number except ending in a "B" instead of an "A". Second write driver circuit 1000B may differ from first write driver circuit 1000A in that second write driver circuit 1000B receives data signal Din_ (the complement of data signal Din) instead of data signal Din and may provide one of local input/output signals LIO as an output, instead of one of local input/output signals LIO_. Local input/output signals (LIO and LIO_) can be complementary data signals.

Figure 11:
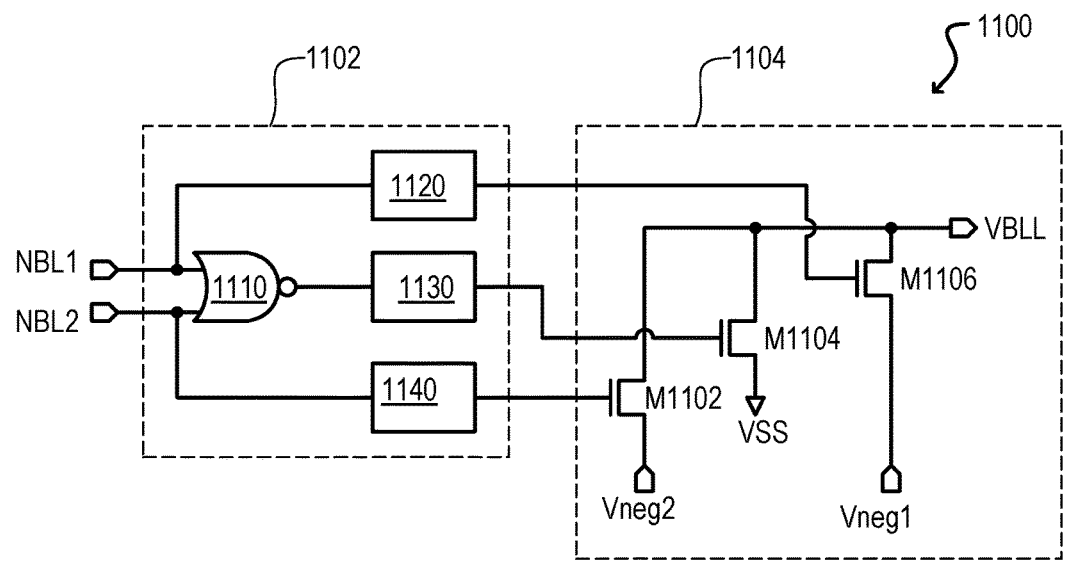
FIG. 11 is a circuit schematic diagram of a write voltage selection circuit according to an embodiment.

Referring now to FIG. 11, a circuit schematic diagram of a write voltage selection circuit according to an embodiment is set forth and given the general reference character 1100. Write voltage selection circuit 1100 may be used as write voltage selection circuit 920 in FIG. 9 and/or write voltage selection circuit 150 in the semiconductor device 100 of FIG. 1.

Write voltage selection circuit 1100 may include a control circuit portion 1102 including logic gate 1110 and voltage translator circuits (1120, 1130, and 1140). Write voltage selection circuit 1100 may also include a write potential selection portion 1104 including IGFETs (M1102, M1104, and M1106).

IGFETs (M1102, M1104, and M1106) may each be n-channel IGFETs.

Logic gate 1110 may be a NOR logic gate.

Logic gate 1110 may receive write assist control signals (NBL1 and NBL2) as inputs at respective input terminals and may provide an output at an output terminal. Level translator circuit 1130 may receive the output of logic gate 1110 and may provide a voltage translated output at an output terminal. Level translator circuit 1130 may partially be powered by boosted power supply potential Vneg2 and may translate a potential received at a ground potential VSS to a signal at a boosted power supply potential Vneg2, where the potential of Vneg2 is substantially lower than ground potential VSS. Level translator circuit 1120 may receive write assist control signal NBL1 and may provide a voltage translated output at an output terminal. Level translator circuit 1120 may partially be powered by boosted power supply potential Vneg2 and may translate a potential received at a ground potential VSS to a signal at a boosted power supply potential Vneg2. Level translator circuit 1140 may receive write assist control signal NBL2 and may provide a voltage translated output at an output terminal. Level translator circuit 1140 may partially be powered by boosted power supply potential Vneg2 and may translate a potential received at a ground potential VSS to a signal at a boosted power supply potential Vneg2.

IGFET M1102 may have a source terminal connected to boosted power supply potential Vneg2 and may have a drain terminal connected to provide write potential VBLL. IGFET M1102 may have a gate terminal connected to receive the output of level translator circuit 1140. Write assist control signal NBL2 may be a first boosted power supply selection signal.

IGFET M1104 may have a source terminal connected to ground potential VSS and may have a drain terminal connected to provide write potential VBLL. IGFET M1104 may have a gate terminal connected to receive the output of level translator circuit 1130. The output of logic gate 1110 may be a normal power supply selection signal that can select the ground potential VSS in which semiconductor device 100 is operating to provide the write potential VBLL.

IGFET M1106 may have a source terminal connected to boosted power supply potential Vneg1 and may have a drain terminal connected to provide write potential VBLL. IGFET M1106 may have a gate terminal connected to receive the output of level translator circuit 1120. Write assist control signal NBL1 may be a second boosted power supply selection signal.

Boosted power supply potential Vneg1 may have a potential that is substantially lower than ground potential VSS. Boosted power supply potential Vneg2 may have a potential that is substantially lower than boosted power supply potential Vneg1.

Figure 12:
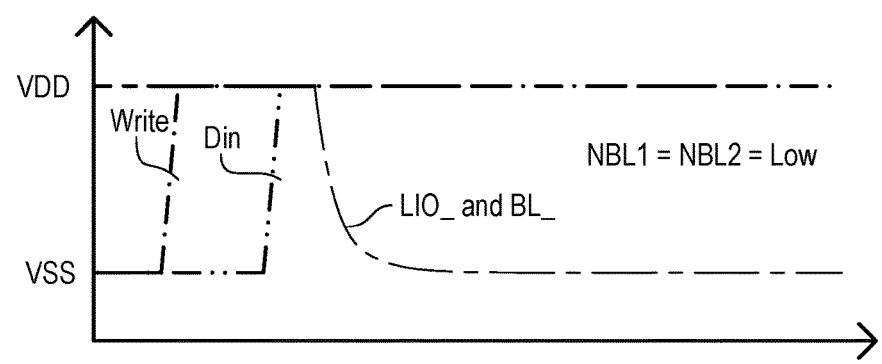
FIG. 12 is a waveform diagram illustrating various write signals according to an embodiment.

Referring now to FIG. 12, a waveform diagram of various write signals is set forth.

The waveform diagram shows write signal Write, data signal Din, and local input output signal LIO_ and bit line signal BL_ when both write assist signals (NBL1 and NBL2) are at low logic levels, thus indicating normal operating conditions for power supply potential VDD and/or temperature of semiconductor device 100.

When write assist signals (NBL1 and NBL2) are at low logic levels, the output of logic gate 1110 in control circuit portion 1102 of write voltage selection circuit 1100 (FIG. 11) may be at a high logic level. Level translator circuit 1130 may provide a high logic output and IGFET M1104 may be turned on to provide a write potential VBLL having essentially a ground potential VSS.

In this way, when write signal Write is at a high logic level, data (in this case data signal Din) can be written into a selected SRAM memory cell 200 (FIG. 2) by pulling either bit line BL (for a data zero) or complementary bit line BL_ (for a data one) toward a ground potential VSS as illustrated in FIG. 12.

Figure 13:
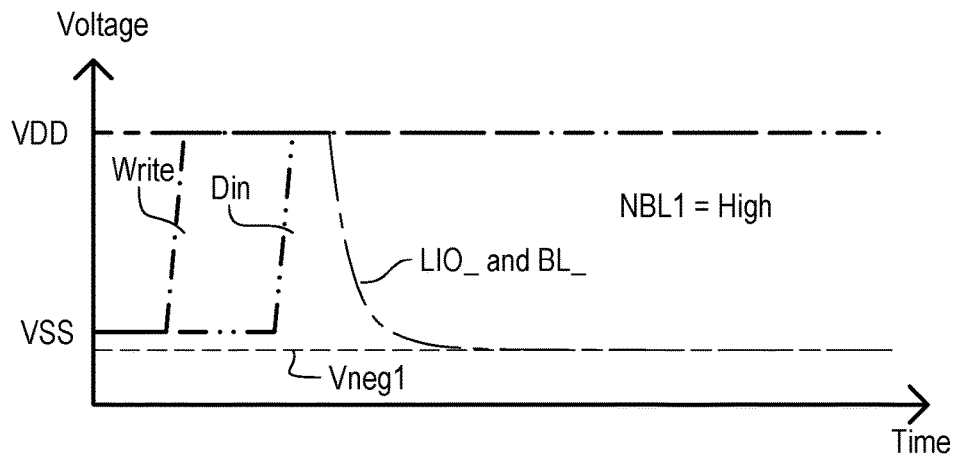
FIG. 13 is a waveform diagram illustrating various write signals according to an embodiment.

Referring now to FIG. 13, a waveform diagram of various write signals is set forth.

The waveform diagram shows write signal Write, data signal Din, and local input output signal LIO_ and bit line signal BL_ when write assist signal NBL1 is at a high logic level, thus indicating a first extreme operating condition for power supply potential VDD and/or temperature of semiconductor device 100.

When write assist signal NBL1 is at a high logic level, the output of level translator circuit 1120 may be at a high logic level and IGFET M1106 may be turned on to provide a write potential VBLL having essentially boosted power supply potential Vneg1.

In this way, when write signal Write is at a high logic level, data (in this case data signal Din) can be written into a selected SRAM memory cell 200 (FIG. 2) by pulling either bit line BL (for a data zero) or complementary bit line BL_ (for a data one) toward a boosted power supply potential Vneg1 as illustrated in FIG. 13.

Figure 14:
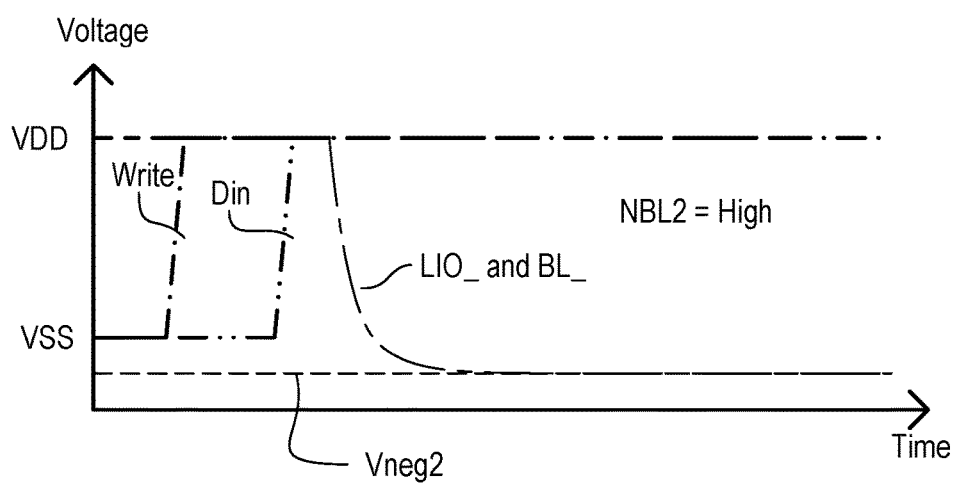
FIG. 14 is a waveform diagram illustrating various write signals according to an embodiment.

Referring now to FIG. 14, a waveform diagram of various write signals is set forth.

The waveform diagram shows write signal Write, data signal Din, and local input output signal LIO_ and bit line signal BL_ when write assist signal NBL2 is at a high logic level, thus indicating a second extreme operating condition for power supply potential VDD and/or temperature of semiconductor device 100.

When write assist signal NBL2 is at a high logic level, the output of level translator circuit 1140 may be at a high logic level and IGFET M1102 may be turned on to provide a write potential VBLL having essentially boosted power supply potential Vneg2.

In this way, when write signal Write is at a high logic level, data (in this case data signal Din) can be written into a selected SRAM memory cell 200 (FIG. 2) by pulling either bit line BL (for a data zero) or complementary bit line BL_ (for a data one) toward a boosted power supply potential Vneg2 as illustrated in FIG. 14.

Figure 15:
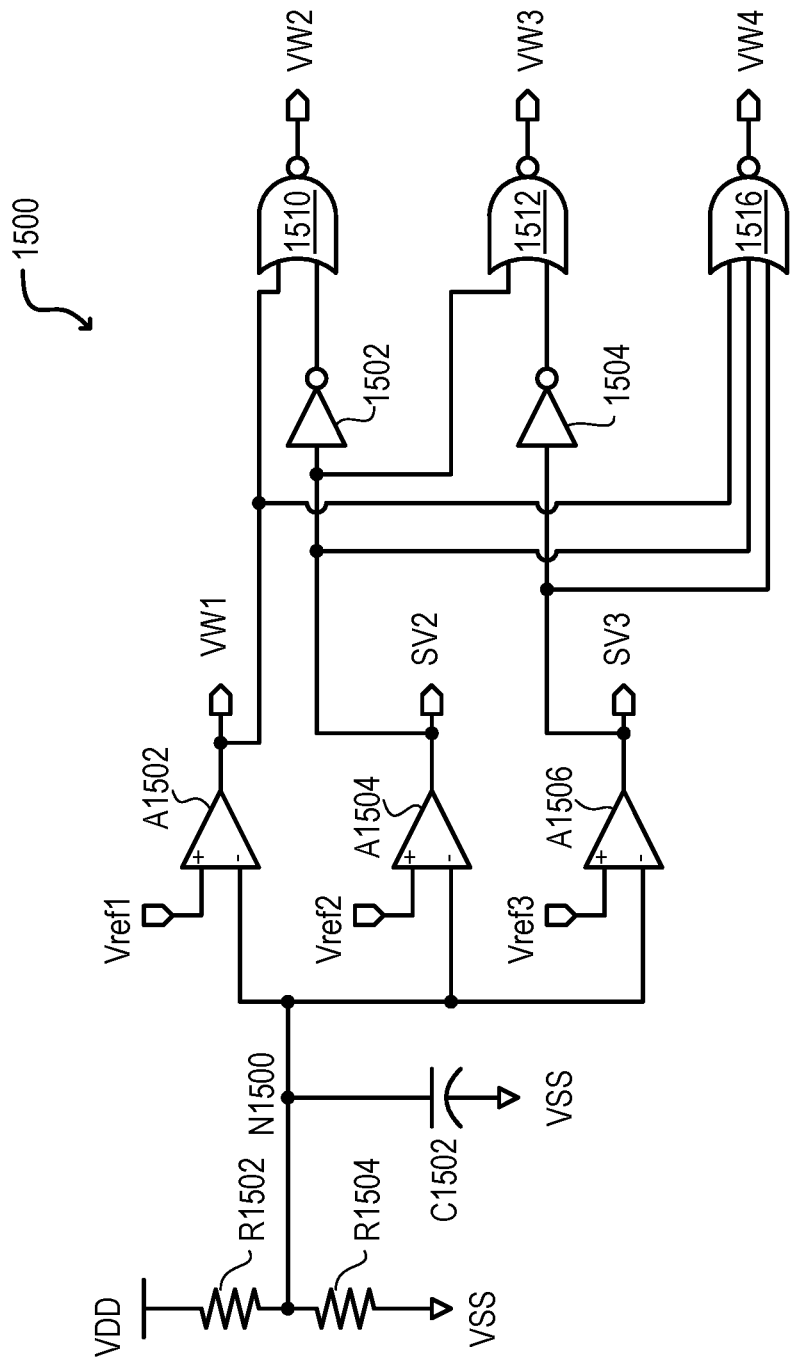
FIG. 15 is a circuit schematic diagram of a voltage detector circuit according to an embodiment.

Referring now to FIG. 15, a circuit schematic diagram of a voltage detector circuit according to an embodiment is set forth and given the general reference character 1500. Voltage detector circuit 1500 may be used as voltage detector circuit 110 in semiconductor device 100 of FIG. 1.

Voltage detector circuit 1500 may receive power supply potential VDD and reference potentials (Vref1, Vref2, and Vref3) and may provide voltage window signals (VW1 to VW4).

Voltage detector circuit 1500 may include resistors (R1502 and R1504), a capacitor C1502, amplifier circuits (A1502, A1504, and A1506) and logic gate circuits (1502, 1504, 1510, 1512, and 1516). Logic gate circuits (1502 and 1504) may be inverter circuits. Logic gate circuits (1510, 1512, and 1516) may be NOR logic gate circuits.

Resistor R1502 may have a first terminal connected to receive power supply potential VDD and a second terminal connected to a node N1500. Resistor R1504 may have a first terminal connected to a ground potential VSS and a second terminal connected to node N1500. Capacitor C1502 may have a first terminal connected to node N1500 and a second terminal connected to ground potential VSS.

Amplifier circuit A1502 may have a first input terminal (negative input terminal) connected to node N1500 and a second input terminal (positive input terminal) connected to receive reference potential Vref1. Amplifier circuit A1502 may provide voltage window signal VW1 at an output terminal.

Amplifier circuit A1504 may have a first input terminal (negative input terminal) connected to node N1500 and a second input terminal (positive input terminal) connected to receive reference potential Vref2. Amplifier circuit A1504 may provide a signal SV2 at an output terminal.

Amplifier circuit A1506 may have a first input terminal (negative input terminal) connected to node N1500 and a second input terminal (positive input terminal) connected to receive reference potential Vref3. Amplifier circuit A1506 may provide a signal SV3 at an output terminal.

Logic gate circuit 1502 may receive the output of amplifier A1504 at an input terminal and may provide an output at an output terminal. Logic gate 1510 may receive the output of logic gate 1502 at a first input terminal and voltage window signal VW1 at a second input terminal and may provide voltage window signal VW2 at an output terminal.

Logic gate circuit 1504 may receive the output of amplifier A1506 at an input terminal and may provide an output at an output terminal. Logic gate 1512 may receive the output of logic gate 1504 at a first input terminal and the output of amplifier A1504 at a second input terminal and may provide voltage window signal VW3 at an output terminal.

Logic gate circuit 1516 may receive the outputs of amplifiers (A1502, A1504, and A1506) at respective input terminals and may provide voltage window signal VW4 at an output terminal.

It should be noted that reference potentials (Vref1, Vref2, and Vref3) may be generated from a reference potential generator, such as a band gap reference generator, that provides substantially constant potentials over a wide temperature and voltage range.

Figure 16:
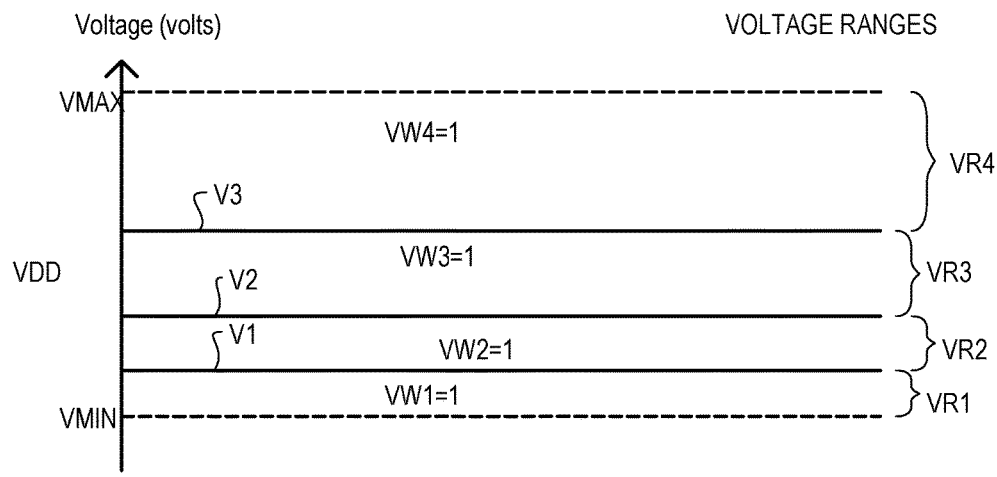
FIG. 16 is a diagram illustrating various voltage windows and voltage window signals according to an embodiment.

FIG. 16 is a diagram illustrating the voltage window signal (VW1 to VW4) logic levels over voltage (potential) ranges of power supply potential VDD.

Referring now to FIG. 15 in conjunction with FIG. 16, the operation of voltage detector circuit 1500 will now be explained.

Voltage VMIN may be a minimum potential for power supply potential VDD in accordance with an allowable voltage range in which semiconductor device 100 may operate in accordance with a datasheet or other specification. Voltage VMAX may be a maximum potential for power supply potential VDD in accordance with an allowable voltage range in which semiconductor device 100 may operate in accordance with a datasheet or other specification.

The voltage windows (VR1 to VR4) illustrated in FIG. 16 are as follows.

Voltage window VR4 is the uppermost voltage window in which semiconductor device 100 is operating at normal power supply potential VDD (above potential V3) within the allowable specification. Voltage window VR3 may be when semiconductor device 100 is operating with a power supply potential VDD between potential V2 and potential V3. Voltage window VR2 may be when semiconductor device 100 is operating with a power supply potential VDD between potential V1 and potential V2. Voltage window VR1 may be when semiconductor device 100 is operating with a power supply potential VDD below potential V1 and above the minimum allowable power supply potential VMIN within the allowable specification. Voltage window VR4 may be considered an upper voltage window. Voltage window VR1 may be considered a lower voltage window. Voltage window VR4 may be substantially wider (has a greater potential difference between upper and lower limits (i.e. potential V3 and potential VMAX) than voltage window VR1 (between potential VMIN and potential V1).

When power supply potential VDD is above potential V3, the output of voltage divider circuit (resistor R1502 and resistor R1504) at node N1500 may be above all reference potentials (Vref1, Vref2, and Vref3). In this way, amplifier circuits (A1502, A1504, and A1506) may provide respective output signals having a low logic level and voltage window signals (VW1, VW2, and VW3) may each be at a low logic level. However, because all three input signals received by logic gate circuit 1516 are each at a low logic level, logic gate circuit 1516 may provide a voltage window signal VW4 having a high logic level, indicating that power supply potential VDD is in a predetermined range or window (above potential V3 all the way to a maximum potential VMAX in which semiconductor device 100 may operate).

When power supply potential VDD is below potential V3, but above potential V2, the output of voltage divider circuit at node N1500 may be below reference potential Vref3 and above reference potentials (Vref2 and Vref1). Under this condition, amplifier circuits (A1502 and A1504) may provide respective output signals having a low logic level and amplifier circuit A1506 may provide an output signal having a high logic level. In this way, voltage window signals (VW1, VW2, and VW4) may have low logic levels. However, with the output of amplifier circuit A1506 having a high logic level and the output of amplifier circuit A1504 having a low logic level, logic gate circuit 1512 may provide a voltage window signal VW3 having a high logic level, indicating that power supply potential VDD is in a predetermined range or window (below potential V3 and above potential V2).

When power supply potential VDD is below potential V2, but above potential V1, the output of voltage divider circuit at node N1500 may be below reference potentials (Vref2 and Vref3) and above reference potential Vref1. Under this condition, amplifier circuit A1502 may provide an output signal having a low logic level and amplifier circuits (A1504 and A1506) may provide respective output signals having a high logic level. In this way, voltage window signals (VW1, VW3, and VW4) may have low logic levels. However, with the output of amplifier circuit A1504 having a high logic level and the output of amplifier circuit A1502 having a low logic level, logic gate circuit 1510 may provide a voltage window signal VW2 having a high logic level, indicating that power supply potential VDD is in a predetermined range or window (below potential V2 and above potential V1).

When power supply potential VDD is below potential V1, the output of voltage divider circuit at node N1500 may be below reference potentials (Vref1, Vref2, and Vref3). Under this condition, amplifier circuits (A1502, A1504, and A1506) may each provide respective output signals having a high logic level. In this way, voltage window signals (VW2, VW3, and VW4) may have low logic levels. However, amplifier circuit A1502 provides voltage window signal VW1 having a high logic level, indicating that power supply potential VDD is in a predetermined range or window (below potential V1 to a minimum potential VMIN in which semiconductor device 100 may operate).

By fabricating resistors (R1502 and R1504) out of essentially identical materials, temperature affects may be minimized. Capacitor C1502 may provide a filter to prevent glitches (noise) in power supply potential VDD from inadvertently causing voltage detector circuit 1500 from errantly transitioning voltage window signals (VW1 to VW4).

The potential at node N1500 may be a potential that is directly proportional to power supply potential VDD.

As discussed above, voltage detector circuit 1500 may indicate that semiconductor device 100 is operating in a predetermined potential or voltage window by way of providing a high logic level on a predetermined one of voltage window signals (VW1 to VW4).

Figure 17:
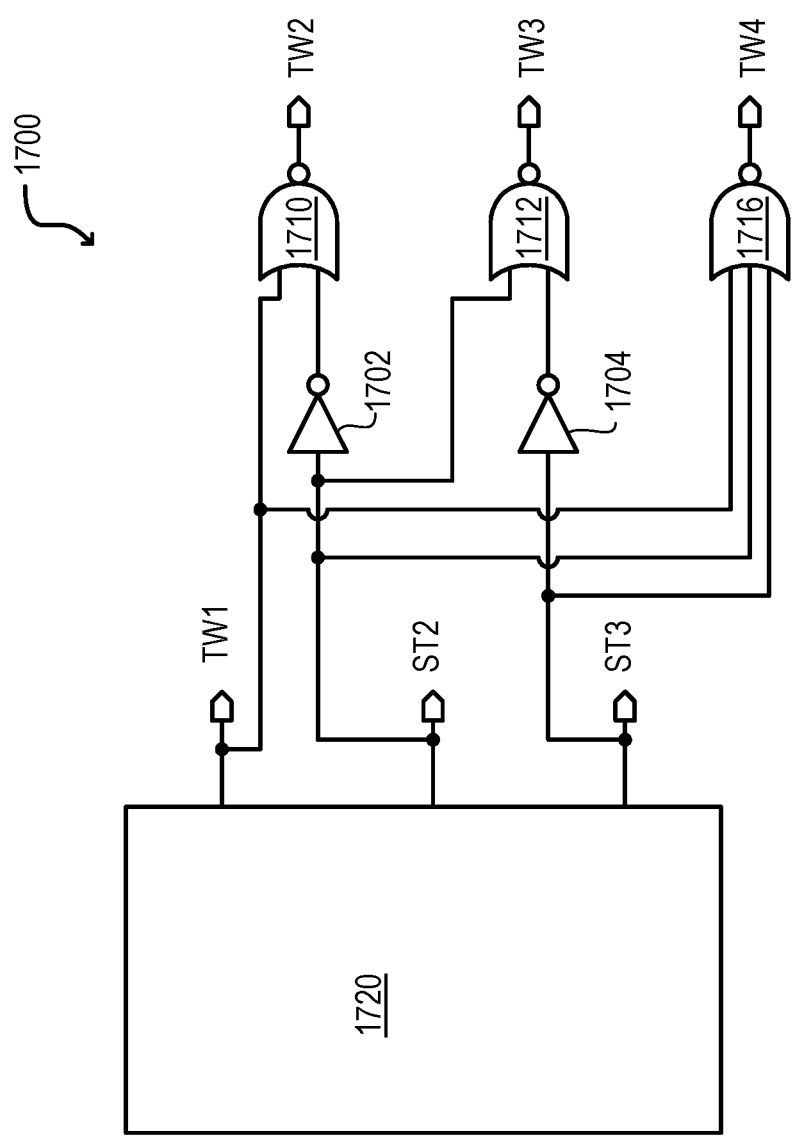
FIG. 17 is a circuit schematic diagram of a temperature detector circuit according to an embodiment.

Referring now to FIG. 17, a circuit schematic diagram of a temperature detector circuit according to an embodiment is set forth and given the general reference character 1700. Temperature detector circuit 1700 may be used as temperature detector circuit 114 in semiconductor device 100 of FIG. 1.

Temperature detector circuit 1700 may provide temperature window signals (TW1 to TW4) in response to a temperature of semiconductor device 100 (FIG. 1).

Temperature detector circuit 1700 may include a temperature sensor circuit 1720 and logic gate circuits (1702, 1704, 1710, 1712, and 1716). Logic gate circuits (1702 and 1704) may be inverter circuits. Logic gate circuits (1710, 1712, and 1716) may be NOR logic gate circuits.

Temperature sensor circuit 1720 may provide temperature window signal TW1 and temperature signals (ST2 and ST3) as output signals at respective output terminals.

Logic gate circuit 1702 may receive temperature signal ST2 at an input terminal and may provide an output at an output terminal. Logic gate 1710 may receive the output of logic gate 1702 at a first input terminal and temperature window signal TW1 at a second input terminal and may provide temperature window signal TW2 at an output terminal.

Logic gate circuit 1704 may receive temperature signal ST3 at an input terminal and may provide an output at an output terminal. Logic gate 1712 may receive the output of logic gate 1704 at a first input terminal and temperature signal ST2 at a second input terminal and may provide temperature window signal TW3 at an output terminal.

Logic gate circuit 1716 may receive temperature window signal TW1 and temperature signals (ST2 and ST3) at respective input terminals and may provide temperature window signal TW4 at an output terminal.

Figure 18:
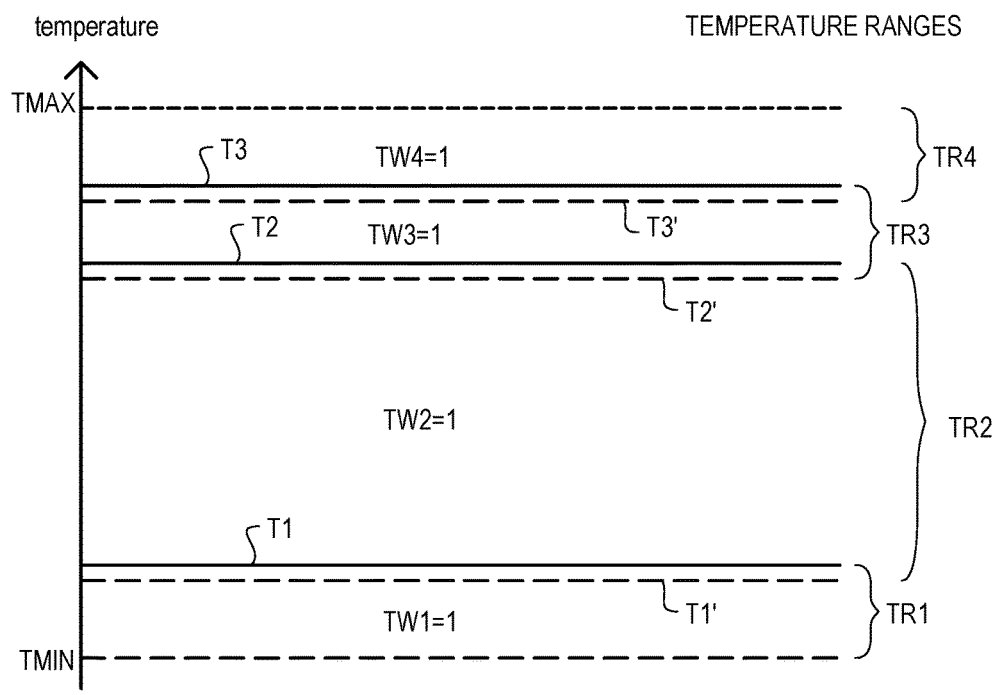
FIG. 18 is a diagram illustrating various temperature windows and temperature window signals according to an embodiment.

FIG. 18 is a diagram illustrating the temperature window signal (TW1 to TW4) logic levels over temperature ranges of semiconductor device 100.

Referring now to FIG. 17 in conjunction with FIG. 18, the operation of temperature detector circuit 1700 will now be explained.

The temperature windows (TR1 to TR4) illustrated in FIG. 18 are as follows.

Temperature window TR4 is the uppermost temperature window (semiconductor device 100 is operating at an extreme temperature within the allowable temperature specification). Temperature window TR4 may have an upper limit shown as a maximum temperature TMAX in which semiconductor device 100 may operate and may have a lower limit shown as temperature T3'. Temperature window signal TW4 may have a high logic value when semiconductor device 100 has a temperature within this range. In this range, temperature sensor circuit 1720 may provide a temperature window signal TW1 having a low logic level and temperature signals (ST2 and ST3) having low logic levels. Under these conditions, temperature window signals (TW1, TW2, and TW3) may have low logic levels and temperature window signal TW4 may have a high logic level.

Temperature window TR3 has an upper limit temperature T3 and a lower limit temperature T2'. Temperature window signal TW3 may have a high logic value when semiconductor device 100 has a temperature within this range. In this range, temperature sensor circuit 1720 may provide a temperature window signal TW1 having a low logic level and temperature signal ST2 may have a low logic level. Temperature signal ST3 may have a high logic level. Under these conditions, temperature window signals (TW1, TW2, and TW4) may have low logic levels and temperature window signal TW3 may have a high logic level.

Temperature window TR2 has an upper limit temperature T2 and a lower limit temperature T1'. Temperature window signal TW2 may have a high logic value when semiconductor device 100 has a temperature within this range. In this range, temperature sensor circuit 1720 may provide a temperature window signal TW1 having a low logic level. Temperature signals (ST2 and ST3) may have a high logic level. Under these conditions, temperature window signals (TW1, TW3, and TW4) may have low logic levels and temperature window signal TW2 may have a high logic level.

Temperature window TR1 has an upper limit temperature T1 and a lower limit temperature that is a minimum temperature TMIN in which semiconductor device 100 may operate within the specification. Temperature window signal TW1 may have a high logic value when semiconductor device 100 has a temperature within this range. In this range, temperature sensor circuit 1720 may provide a temperature window signal TW1 having a high logic level and temperature signals (ST2 and ST3) may each have a high logic level. Under these conditions, temperature window signals (TW2, TW3, and TW4) may have low logic levels and temperature window signal TW1 may have a high logic level.

Temperature sensor circuit 1720 may provide temperature window signal TW1 and temperature signals (ST2 and ST3) that can have hysteresis with respect to temperature. When temperature increases from minimum temperature TMIN, temperature window signal TW1 and temperature signals (ST2 and ST3) may all have high logic levels. As temperature increases to temperature T1, temperature window signal TW1 may transition to a low logic level. As temperature increases to temperature T2, temperature signal ST2 may transition to a low logic level. As temperature increases to temperature T3, temperature signal ST3 may transition to a low logic level. However, as temperature decreases from maximum temperature TMAX, temperature signals (ST3 and ST2) may respectively transition back to a high logic level at temperatures (T3' and T2'), respectively and temperature window signal TW1 may transition back to a high logic level at temperature T1'.

Temperature window TR2 may be substantially larger than extreme temperature windows (TR1, TR3, and TR4) and may occupy a large central region of the temperature limits (TMAX and TMIN) in which semiconductor device 100 may operate under the device specification as set forth in a datasheet or other specification.

An example of a temperature sensor circuit that may be used as temperature sensor circuit 1720 is disclosed in FIG. 3a of U.S. Pat. No. 7,383,149 by Walker, the contents of which are incorporated herein by reference. Temperature sensor circuit 1720 could include three temperature sensing circuits (300-2) of FIG. 3a disclosed in Walker (U.S. Pat. No. 7,383,149), each having different temperature trip points. For example, a first temperature sensing circuit would have temperature trip points of temperature T1 in an increasing temperature direction and temperature T1' in a decreasing temperature direction. A second temperature sensing circuit would have temperature trip points of temperature T2 in an increasing temperature direction and temperature T2' in a decreasing temperature direction. A third temperature sensing circuit would have temperature trip points of temperature T3 in an increasing temperature direction and temperature T3' in a decreasing temperature direction.

Figure 19:
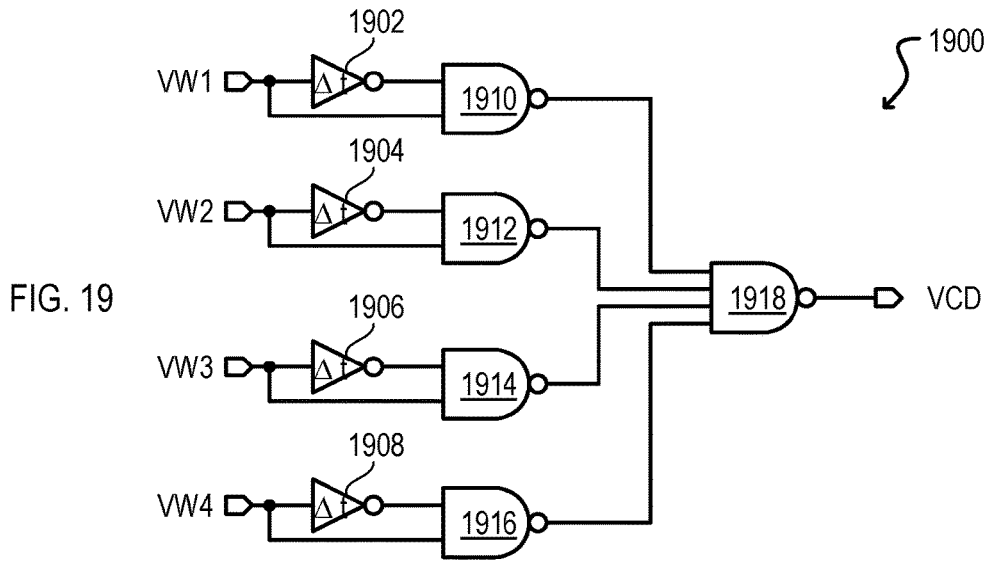
FIG. 19 is a circuit schematic diagram of a voltage window change detector circuit according to an embodiment.

Referring now to FIG. 19, a voltage window change detector circuit according to an embodiment is set forth in a circuit schematic diagram and given the general reference character 1900. Voltage window change detector circuit 1900 may be used as voltage window change detector circuit 118 in semiconductor device 100 of FIG. 1.

Voltage window change detector circuit 1900 can include inverting delay stages (1902, 1904, 1906, and 1908) and logic gate circuits (1910, 1912, 1914, 1916, and 1918). Logic gate circuits (1910, 1912, 1914, 1916, and 1918) may be NAND logic gates.

Voltage window change detector circuit 1900 may receive voltage window signals (VW1, VW2, VW3, and VW4) as inputs and may provide voltage change detection signal VCD as an output.

Inverting delay stage 1902 may receive voltage window signal VW1 at an input terminal and may provide an output at an output terminal. Logic gate circuit 1910 may receive the output of inverting delay stage 1902 and voltage window signal VW1 at respective input terminals and may provide an output at an output terminal. Inverting delay stage 1904 may receive voltage window signal VW2 at an input terminal and may provide an output at an output terminal. Logic gate circuit 1912 may receive the output of inverting delay stage 1904 and voltage window signal VW2 at respective input terminals and may provide an output at an output terminal. Inverting delay stage 1906 may receive voltage window signal VW3 at an input terminal and may provide an output at an output terminal. Logic gate circuit 1914 may receive the output of inverting delay stage 1906 and voltage window signal VW3 at respective input terminals and may provide an output at an output terminal. Inverting delay stage 1908 may receive voltage window signal VW4 at an input terminal and may provide an output at an output terminal. Logic gate circuit 1916 may receive the output of inverting delay stage 1908 and voltage window signal VW4 at respective input terminals and may provide an output at an output terminal.

Logic gate circuit 1918 may receive the outputs of logic gate circuits (1910, 1912, 1914, and 1916) at respective input terminals and may provide voltage change detection signal VCD at an output terminal.

Voltage window change detector circuit 1900 may operate to generate a voltage change detection signal VCD having a positive pulse output (high logic level pulse) in response to any of voltage window signals (VW1 to VW4) transitioning from a low logic level to a high logic level. For example, when voltage window signal VW1 has a low logic level, the output of inverting delay stage 1902 may have a high logic level and the output of logic gate circuit 1910 may be at a high logic level and logic gate circuit 1918 can generate voltage change detection signal VCD having a low logic level (logic gates (1912, 1914, and 1916) provide outputs having high logic levels. When voltage window signal VW1 transitions to a high logic level, the output of logic gate circuit 1910 may transition from a logic high level to a logic low level. In response to this, logic gate circuit 1918 may provide a voltage change detection signal VCD that transitions to a high logic level. After a predetermined delay time Δt, the output of inverting delay stage 1902 may transition to a low logic level. In response to this the output of logic gate circuit 1910 may transition back to a high logic level and logic gate circuit 1918 may provide a voltage change detection signal VCD that transitions back to a low logic level. In this way, voltage window change detector circuit 1900 may generate a pulse having a pulse width essentially determined by the predetermined delay Δt of a respective delay stage (1902, 1904, 1906, and 1908) in response to a respective voltage window signal (VW1 to VW4) transitioning from a low logic level to a high logic level, thereby indicating that the voltage window or range (VR1 to VR4—FIG. 16) in which semiconductor device 100 is operating in has changed.

Figure 20:
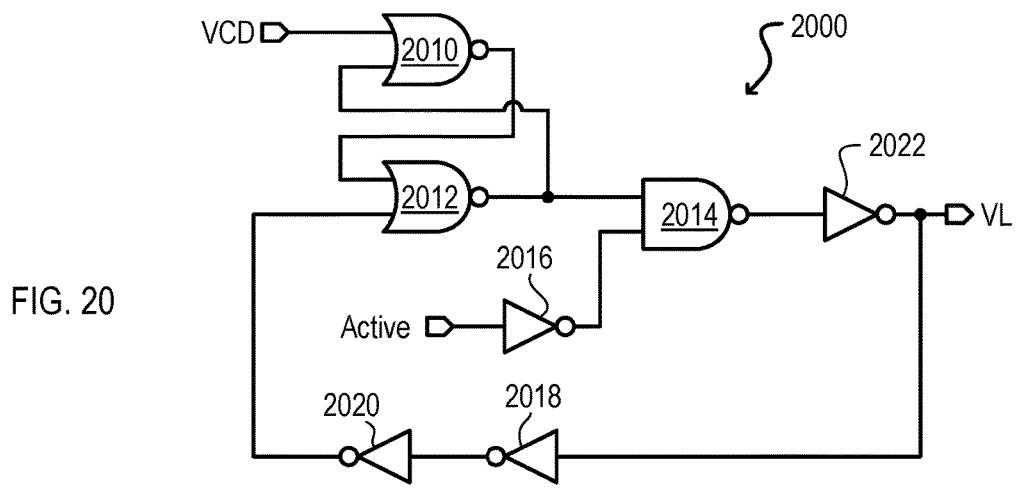
FIG. 20 is a circuit schematic diagram of a voltage latch control circuit according to an embodiment.

Referring now to FIG. 20, a voltage latch control circuit according to an embodiment is set forth in a circuit schematic diagram and given the general reference character 2000.

Voltage latch control circuit 2000 may be used as voltage latch control circuit 134 in semiconductor device 100 of FIG. 1.

Voltage latch control circuit 2000 may receive voltage change detection signal VCD and active signal Active at respective input terminals and may provide a voltage latch signal VL at an output terminal.

Voltage latch control circuit 2000 may include logic gate circuits (2010, 2012, 2014, 2016, 2018, 2020, and 2022). Logic gate circuits (2010 and 2012) may be NOR logic gates configured as a flip-flop circuit. Logic gate circuit 2014 may be a NAND logic gate. Logic gate circuits (2016, 2018, 2020, and 2022) may be inverter logic gates.

Logic gate circuit 2010 may receive voltage change detection signal VCD at an input terminal and may receive the output of logic gate circuit 2012 at another input terminal. Logic gate circuit 2010 may provide an output at an output terminal. Logic gate circuit 2012 may receive the output of logic gate circuit 2010 at an input terminal and may receive the output of logic gate circuit 2020 at another input terminal and may provide an output at an output terminal. Logic gate circuit 2016 may receive active signal Active at an input terminal and may provide an output at an output terminal. Logic gate circuit 2014 may receive the output of logic gate circuit 2012 at an input terminal and the output of logic gate circuit 2016 at another input terminal and may provide an output at an output terminal. Logic gate 2022 may receive the output of logic gate circuit 2014 at an input terminal and may provide voltage latch signal VL at an output terminal. Logic gate circuit 2018 may receive voltage latch signal VL at an input terminal and may provide an output at an output terminal. Logic gate circuit 2020 may receive the output of logic gate circuit 2018 at an input terminal and may provide an output at an output terminal.

Active signal Active may have a high logic level when semiconductor device 100 is in a read or write mode of operation (i.e., read signal Read and/or write signal Write have high logic levels). When active signal Active is at a low logic level, semiconductor device 100 may be in a standby mode of operation.

The operation of voltage latch control circuit 2000 will now be explained. Initially, voltage latch signal VL, the output of logic gate circuit 2012, and voltage change detection signal VCD may each be at a low logic level. In response to this, the output of logic gate circuit 2010 may be at a high logic level. When voltage window change detection circuit 1900 detects a change (low to high logic transition) in any voltage window signal (VW1 to VW4), voltage change detection signal VCD may pulse high. When voltage change detection signal VCD pulses high, the output of logic gate circuit 2010 may transition to a low logic level. With both inputs at a logic low level, the output of logic gate circuit 2012 may be at a high logic level. This sets the latch formed by logic gate circuits (2010 and 2012). Next, when active signal Active become a low logic level (indicating semiconductor device 100 is not in an active mode in which data may be written to or read from a SRAM memory cell 200), the output of logic gate circuit 2014 may transition to a low logic level and voltage latch signal VL may transition to a high logic level. This high logic level may propagate through logic gate circuits (2020 and 2018) to reset the output of logic gate circuit 2012 to a low logic level (resetting the latch or flip-flop formed by logic gate circuits (2010 and 2012). In this way, voltage latch signal VL may transition back to a low logic level. The high pulse width of voltage latch signal VL must have a predetermined pulse width sufficient to allow voltage window signals (VW1 to VW4) to be latched into voltage window latch circuit 126 (FIG. 1).

Figure 21:
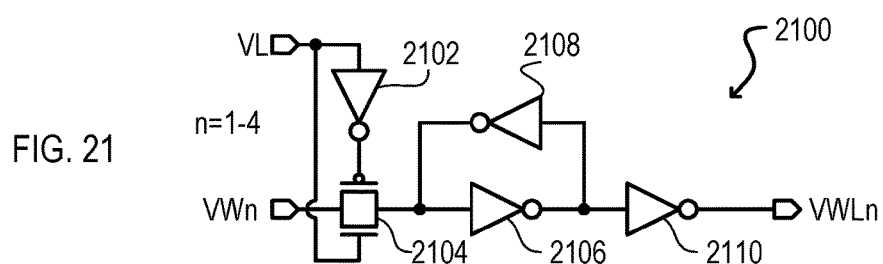
FIG. 21 is a circuit schematic diagram of a voltage window latch circuit according to an embodiment.

Referring now to FIG. 21, a voltage window latch circuit according to an embodiment is set forth in a circuit schematic diagram and given the general reference character 2100.

Voltage window latch circuit 2100 may be used as voltage window latch circuit 126 in semiconductor device 100 in FIG. 1.

Voltage window latch circuit 2100 may receive voltage window signal VWn and voltage latch signal VL at respective input terminals and may provide a latched voltage window signal VWLn at an output terminal. There may be 4 voltage window latch circuits 2100 to form voltage window latch circuit 126 in semiconductor device 100 in FIG. 1.

Voltage window latch circuit 2100 may include logic gate circuits (2102, 2106, 2108 and 2110) and pass gate circuit 2104. Logic gate circuits (2102, 2106, 2108 and 2110) can be inverter logic gates.

Pass gate circuit 2104 may receive voltage window signal VWn at an input terminal and may provide an output at an output terminal. Logic gate circuit 2102 may receive voltage latch signal VL at an input terminal and may provide an output at an output terminal. Pass gate circuit 2104 may receive voltage latch signal VL at an n-type IGFET control terminal and the output of logic gate circuit 2102 at a p-type IGFET control terminal. Logic gate circuit 2106 may receive the output of pass gate circuit 2104 at an input terminal and may provide an output at an output terminal. Logic gate circuit 2108 may receive the output of logic gate circuit 2106 at an input terminal and may have an output terminal connected to the input terminal of logic gate 2106. In this way, logic gate circuits (2106 and 2108) may be cross coupled inverter circuits forming a latch. Logic gate circuit 2110 may receive the output of logic gate circuit 2108 at an input terminal and may provide latched voltage window signal VWLn at an output terminal.

The operation of voltage window latch circuit 2100 will now be explained. When voltage latch signal VL pulses to a high logic level, pass gate circuit 2104 may be turned on to form a low impedance path between input and output terminals. In this way, the logic value of voltage window signal VWn may be driven into and latched by logic gate circuits (2106 and 2108) and output as latched voltage window signal VWLn. After voltage latch signal VL returns to a low logic level, pass gate circuit 2104 may be turned off to provide a high impedance path between input and output terminals and the logic level of latched voltage window signal VWLn may remain latched.

Figure 22:
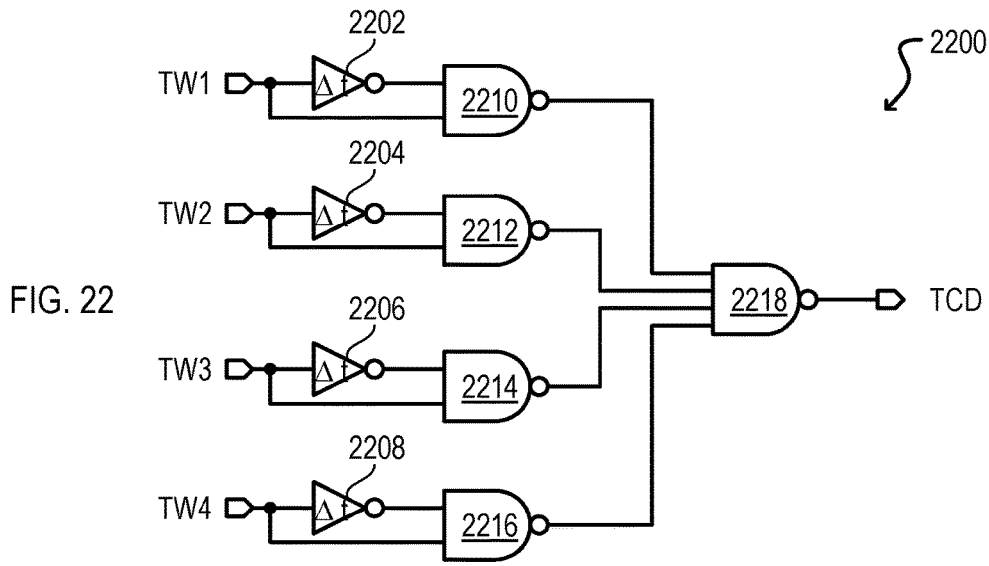
FIG. 22 is a circuit schematic diagram of a temperature window change detector circuit according to an embodiment.

Referring now to FIG. 22, a temperature window change detector circuit according to an embodiment is set forth in a circuit schematic diagram and given the general reference character 2200.

Temperature window change detector circuit 2200 may be used as temperature window change detector circuit 122 in semiconductor device 100 in FIG. 1.

Temperature window change detector circuit 2200 may receive temperature window signals (TW1 to TW4) as inputs at respective input terminals and may provide a temperature change detection signal TCD as an output at an output terminal.

Temperature window change detector circuit 2200 may include the same constituents configured in the same way as voltage window change detector circuit 1900 of FIG. 19 and such constituents may have the same reference character except beginning with a "22" instead of a "19". Furthermore, temperature window signal TW1 may be received at the equivalent input terminal as voltage window signal VW1, temperature window signal TW2 may be received at the equivalent input terminal as voltage window signal VW2, temperature window signal TW3 may be received at the equivalent input terminal as voltage window signal VW3, and temperature window signal TW4 may be received at the equivalent input terminal as voltage window signal VW4. Temperature change detection signal TCD may be provided at the equivalent output terminal as voltage change detection signal VCD.

Otherwise, because the description and operation of temperature window change detector circuit 2200 is the same as the description of voltage change detector circuit 1900, the description will be omitted.

Figure 23:
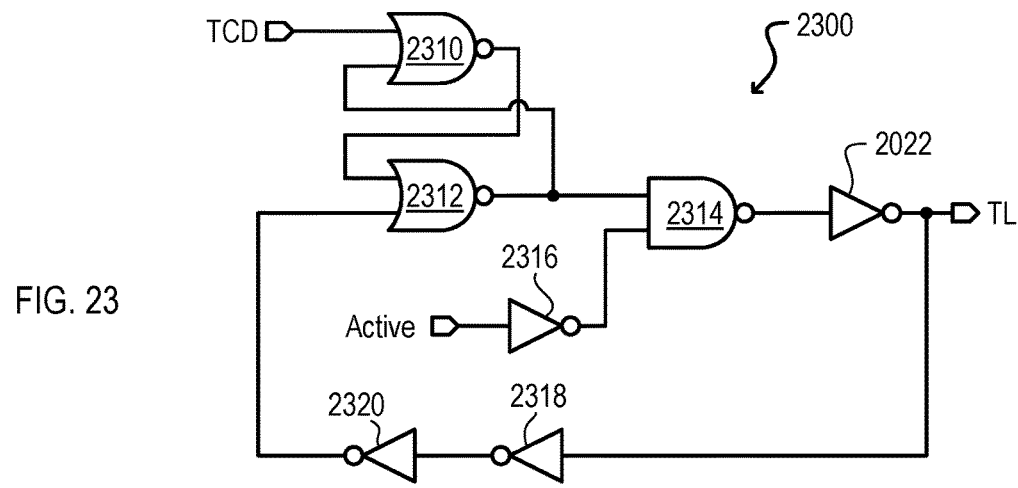
FIG. 23 is a circuit schematic diagram of a temperature latch control circuit according to an embodiment.

Referring now to FIG. 23, a temperature latch control circuit according to an embodiment is set forth in a circuit schematic diagram and given the general reference character 2300.

Temperature latch control circuit 2300 may be used as temperature latch control circuit 138 in semiconductor device 100 of FIG. 1.

Temperature latch control circuit 2300 may receive temperature change detection signal TCD and active signal Active at respective input terminals and may provide temperature latch signal TL at an output terminal.

Temperature latch control circuit 2300 may include the same constituents configured in the same way as voltage latch control circuit 2000 of FIG. 20 and such constituents may have the same reference character except beginning with a "23" instead of a "20". Furthermore, temperature change detection signal TCD may be received at the equivalent input terminal as voltage change detection signal VCD. Temperature latch signal TL may be provided at the equivalent output terminal as voltage latch signal VL.

Otherwise, because the description and operation of temperature latch control circuit 2300 is the same as the description of voltage latch control circuit 2000, the description will be omitted.

Figure 24:
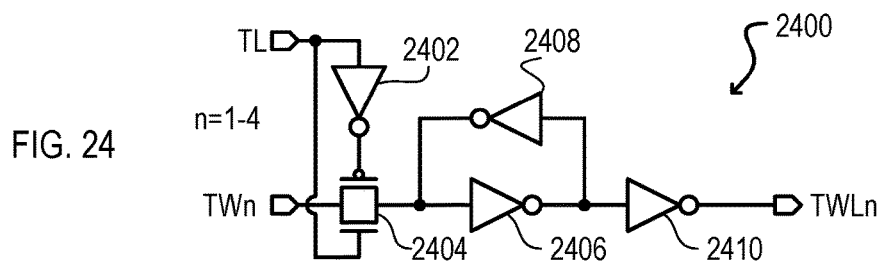
FIG. 24 is a circuit schematic diagram of a temperature window latch circuit according to an embodiment.

Referring now to FIG. 24, a temperature window latch circuit according to an embodiment is set forth in a circuit schematic diagram and given the general reference character 2400.

Temperature window latch circuit 2400 may be used as temperature window latch circuit 130 in semiconductor device 100 of FIG. 1.

Temperature window latch circuit 2400 may receive temperature window signal TWn and temperature latch signal TL at respective input terminals and may provide a latched temperature window signal TWLn at an output terminal. There may be 4 temperature window latch circuits 2400 to form temperature window latch circuit 130 in semiconductor device 100 in FIG. 1.

Temperature window latch circuit 2400 may include the same constituents configured in the same way as voltage window latch circuit 2100 of FIG. 21 and such constituents may have the same reference character except beginning with a "24" instead of a "21". Furthermore, temperature window signal TWn may be received at the equivalent input terminal as voltage window signal VWn and temperature latch signal TL may be received at the equivalent input terminal as voltage latch signal VL. Latched temperature window signal TWLn may be provided at the equivalent output terminal as latched voltage window signal VWLn.

Otherwise, because the description and operation of temperature window latch circuit 2400 is the same as the description of voltage window latch circuit 2100, the description will be omitted.

Figure 25A:
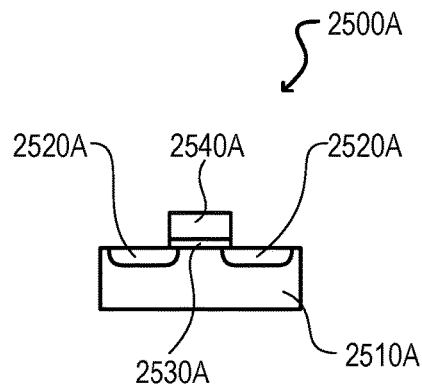
FIG. 25A is a cross-sectional diagram of an insulated gate field effect transistor (IGFET).
Figure 25B:
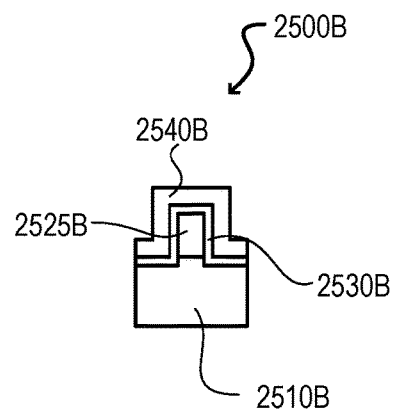
FIG. 25B is a cross-sectional diagram of an insulated gate field effect transistor (IGFET).

Referring now to FIG. 25A and FIG. 25B, examples of IGFETs that may be used for IGFETs (MN1, MN2, MN3, MN4, MP1 and MP2) of SRAM memory cell 200 of FIG. 2. FIG. 25A is a cross sectional diagram of a planar IGFET. FIG. 25B is a cross sectional diagram of a FinFET type IGFET.

FIG. 25A may include an IGFET 2500A. IGFET 2500A may include a body region 2510A, source/drain regions 2520A, a gate insulator 2530A, and a gate 2540A. In a p-type IGFET, IGFET 2500A may have a p-type source/drain region 2520A and a n-type body region 2510A.

FIG. 25B may include a IGFET 2500B. IGFET 2500B may include an insulation region 2510B, a channel region 2525B, a gate insulator 2530B and a gate 2540B. Source/drain regions are not illustrated but may be formed on extensions of the "fin" in which channel region 2525B is formed but extending beyond the gate 2540B.

IGFET 2500A may have different temperature characteristics than IGFET 2500B. In particular, a delay time may increase for IGFET 2500A in conjunction with an increase in temperature and a delay time may decrease for IGFET 2500B in conjunction with an increase in temperature. In this way, read assist control circuit 146 and write assist control circuit 142 in semiconductor device 100 may provide read assist control signals (SENAS and WLL) and write assist control signals (NBL1, NBL2, WLH, and VCELL) that may be enabled at different ranges depending on whether IGFET 2500A or IGFET 2500B is used in SRAM memory cell 200.

Figure 26A:
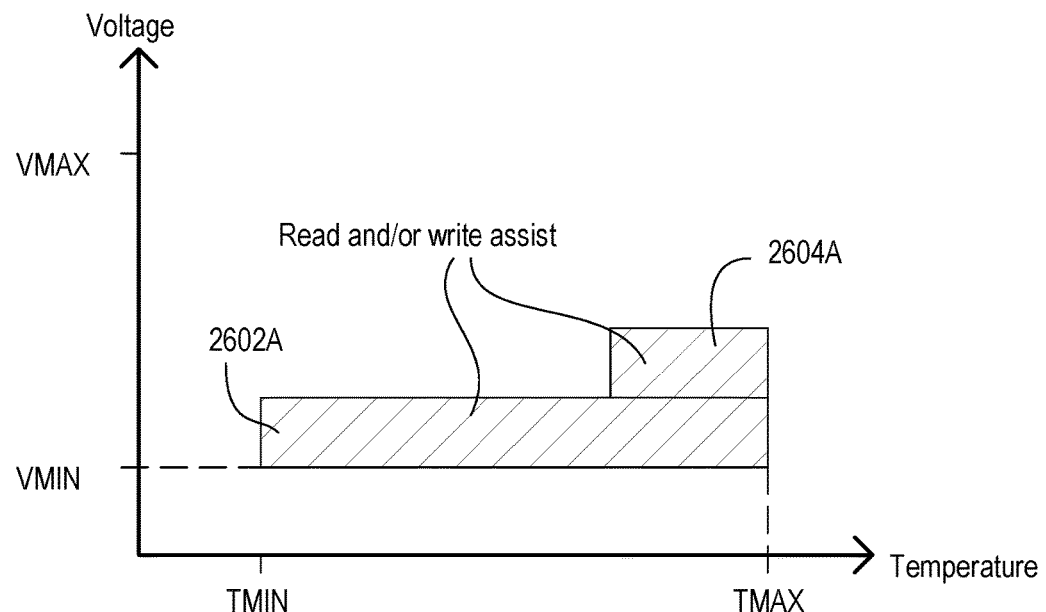
FIG. 26A is a graph illustrating voltage/temperature ranges (windows) in which write assist and/or read assist techniques may be used according to an embodiment.
Figure 26B:
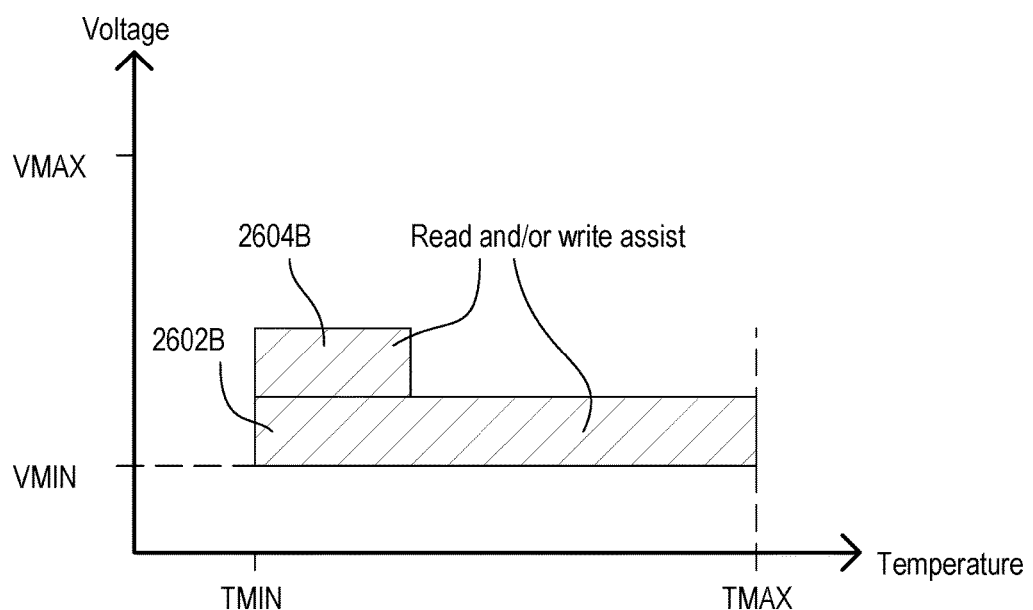
FIG. 26B is a graph illustrating voltage/temperature ranges (windows) in which write assist and/or read assist techniques may be used according to an embodiment.

FIG. 26A is a graph illustrating at what voltage/temperature ranges write assist and read assist techniques may be used when a planar IGFET is used in an SRAM memory cell. FIG. 26B is a graph illustrating at what voltage/temperature ranges write assist and read assist techniques may be used when a FinFET type IGFET is used in an SRAM memory cell.

Voltage VMIN may be a minimum potential for power supply potential VDD in accordance with an allowable voltage range in which semiconductor device 100 may operate in accordance with a datasheet specification. Voltage VMAX may be a maximum potential for power supply potential VDD in accordance with an allowable voltage range in which semiconductor device 100 may operate in accordance with a datasheet specification. Temperature TMIN may be a minimum temperature in accordance with an allowable temperature range in which semiconductor device 100 may operate in accordance with a datasheet specification. Temperature TMAX may be a maximum temperature in accordance with an allowable temperature range in which semiconductor device 100 may operate in accordance with a datasheet specification.

Referring now to FIG. 26A, in an operating region 2602A when power supply potential VDD is below a predetermined level, read and/or write assist techniques may be used over all temperature ranges. However, in an operating region 2604A, when power supply potential VDD is in a predetermined range, the temperature of the semiconductor device must also be in a predetermined range for read and/or write assist techniques to be used. In the operating region 2604A, the temperature may be in an extreme upper range of allowable temperature level (in accordance with a datasheet specification) due to the weakness in planar IGFET characteristics at higher temperatures. Operating region 2602A may be when power supply potential VDD is at an extreme low potential of an allowable potential range in which semiconductor device 100 may operate in accordance with a datasheet specification.

Figure 27:
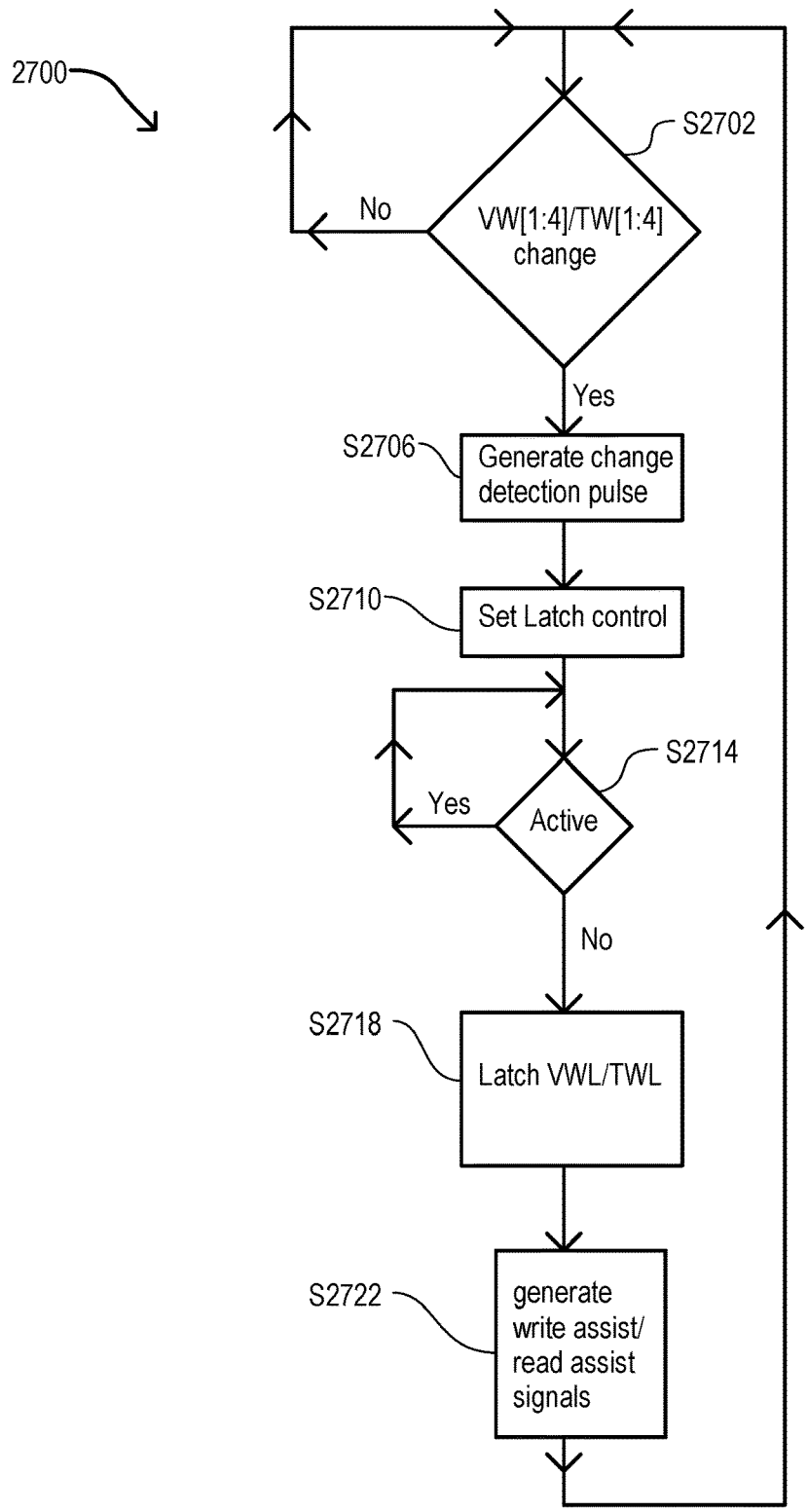
FIG. 27 is a flow diagram of a method of operating a semiconductor device according to an embodiment.

Referring now to FIG. 26B, in an operating region 2602B when power supply potential VDD is below a predetermined level, read and/or write assist techniques may be used over all temperature ranges. However, in an operating region 2604B, when power supply potential VDD is in a predetermined range, the temperature of the semiconductor device must also be in a predetermined range for read and/or write assist techniques to be used. In the operating region 2604B, the temperature may be in an extreme lower range of allowable temperature level (in accordance with a datasheet specification), due to the weakness in FinFET type IGFET characteristics at lower temperatures. Operating region 2602B may be when power supply potential VDD is at an extreme low potential of an allowable potential range in which semiconductor device 100 may operate in accordance with a datasheet specification. Referring now to FIG. 27, a flow diagram illustrating a method of operating a semiconductor device is set forth according to an embodiment and given the general reference character 2700. Method 2700 may be used to operate semiconductor device 100 in FIG. 1.

Reference will now be made to FIG. 27 in conjunction with FIG. 1.

Method 2700 can include a step S2702. Step S2702 is a determination as to whether a change has occurred in the states of any of voltage window signals VW[1:4] or temperature window signals TW[1:4]. If there is no change, the method 2700 returns to step S2702. If there is a change in the states of any of voltage window signals VW[1:4] or temperature window signals TW[1:4], the method 2700 proceeds to a step S2706. In step S2706 a change detection pulse is generated. If there is a change in voltage window signals VW[1:4], a voltage change detection signal VCD is generated as a pulse by voltage window change detector circuit 118. If there is a change in temperature window signals TW[1:4], a temperature change detection signal TCD is generated as a pulse by temperature window change detector circuit 122. The method 2700 then proceeds to a step S2710.

In a step S2710, a latch (e.g., FIG. 20, logic gate circuits (2010 and 2012)) in voltage latch control circuit 134 is set in response to voltage change detection signal VCD being a pulse and/or a latch (e.g., FIG. 23, logic gate circuits (2310 and 2312)) in temperature latch control circuit 138 is set in response to temperature change detection signal TCD being a pulse. The method 2700 then proceeds to a step S2714.

In a step S2714, the process 2700 essentially waits until semiconductor device 100 is no longer in an active mode (i.e., is in a standby mode of operation), such that an active signal Active has a low logic level, thus indicating a read operation or a write operation is not currently being conducted. When semiconductor device 100 is no longer in a predetermined active mode, the method 2700 proceeds to a step S2718.

In a step S2718, voltage window signals VW[1:4] and/or temperature window signals TW[1:4] may be latched in a respective voltage window latch circuit 126 and/or temperature window latch circuit 130 to provide respective latched voltage window signals VWL[1:4] and/or latched temperature window signals TWL[1:4]. The method 2700 then proceeds to a step S2722.

In a step S2722, write assist control circuit 142 receives latched voltage window signals VWL[1:4] and latched temperature window signals TWL[1:4] and generates write assist signals (NBL1, NBL2, WLH, and VCELL) in response thereto. Also in step S2722, read assist control circuit 146 receives latched voltage window signals VWL[1:4] and latched temperature window signals TWL[1:4] and generates read assist signals (SENAS and WLL) in response thereto. Semiconductor device 100 then operates in accordance to the logic states of write assist signals (NBL1, NBL2, WLH, and VCELL) during a write operation and in accordance to the logic states of read assist signals (SENAS and WLL) during a read operation.

The method 2700 may then return to step S2702.

Figure 28:
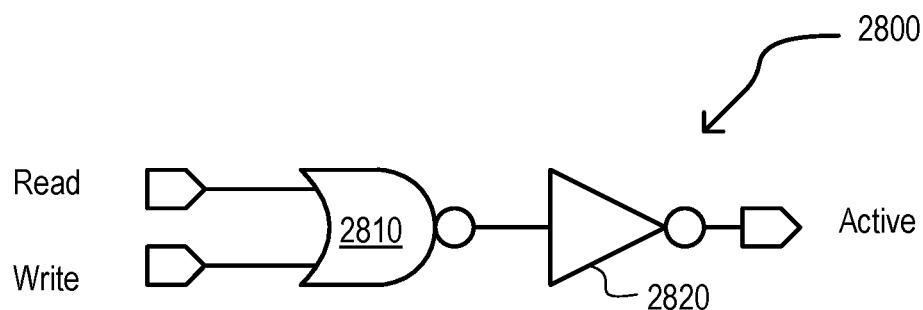
FIG. 28 is circuit schematic diagram of an active signal generation circuit according to an embodiment.

Referring now to FIG. 28, an active signal generation circuit according to an embodiment is set forth and given the general reference character 2800. Active signal generation circuit 2800 may receive read signal Read and a write signal Write at respective input terminals and may generate an active signal Active at an output terminal.

Active signal generation circuit 2800 may include logic gate circuits (2810 and 2820). Logic gate circuit 2810 may be a NOR logic gate and logic gate circuit 2820 may be an inverter logic gate.

Logic gate circuit 2810 may receive read signal Read and a write signal Write at respective input terminals and may generate an output signal at an output terminal. Logic gate circuit 2820 may receive the output signal from logic gate circuit 2810 at an input terminal and may provide active signal Active at an output terminal. Active signal Active may have a high logic level in response to either read signal Read or write signal Write or both having a high logic level. Active signal Active may have a low logic level in response to both read signal Read or write signal Write having a low logic level, respectively.

Figure 29:
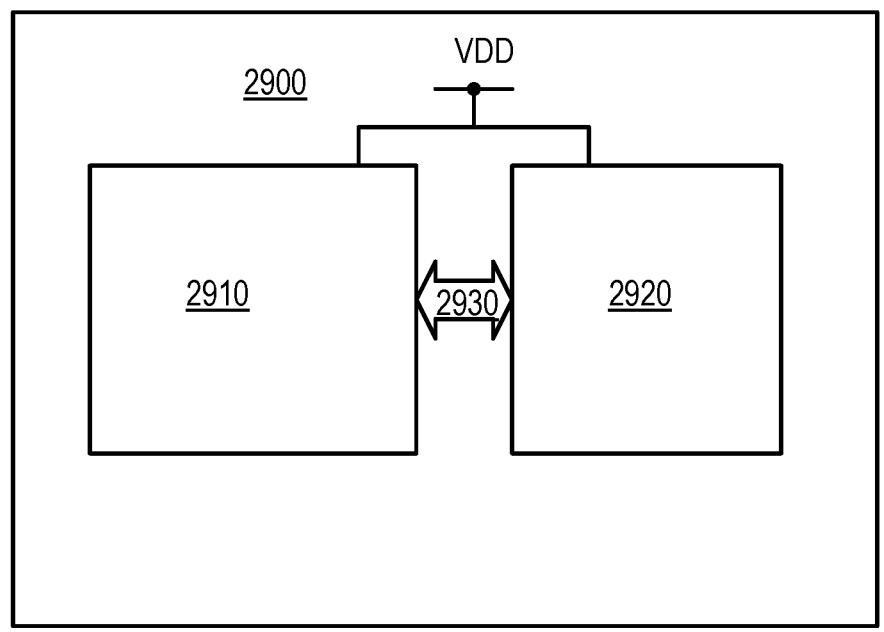
FIG. 29 is a block schematic diagram of a semiconductor device according to an embodiment.

Referring now to FIG. 29, a semiconductor device according to an embodiment is set forth in a block schematic diagram and given the general reference character 2900.

Semiconductor device 2900 may include a processor circuit 2910 and an SRAM circuit 2920. Processor circuit 2910 and SRAM circuit 2920 may be powered by power supply potential VDD. SRAM circuit 2920 may be SRAM device 100 in FIG. 1.

Processor circuit 2910 may transmit and receive data to/from SRAM circuit 2920 along a bus 2930. Bus 2930 may also be used to transmit command signals from processor circuit 2910 to SRAM circuit 2920. Examples of commands may be a read command and/or a write command. A read command may be used to receive data from SRAM circuit 2920 that is stored in a SRAM memory cell (FIG. 2) and a write command may be used to provide data to SRAM circuit 2920 to be stored in a SRAM memory cell (FIG. 2). Processor circuit 2910 may use data from SRAM circuit 2920 for operational or computational purposes.

Voltage window signals VW[1:4] and temperature window signals TW[1:4] can represent voltage window signals VW1 to VW4 and temperature window signals TW1 to TW4. Likewise, latched voltage window signals VWL[1:4] and latched temperature window signals TWL[1:4] can represent latched voltage window signals VWL1 to VWL4 and latched temperature window signals TWL1 to TWL4.

By providing read assist and/or write assist, the reliability of reading and/or writing data to an SRAM cell 200 can be improved at low power supply potentials and/or extreme temperatures of operation.

Power supply potential VDD may provide an upper power rail to semiconductor device 100 and ground potential may provide a lower power rail to semiconductor device 100.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device powered by a first power supply potential, comprising:
a voltage detector circuit coupled to receive the first power supply potential and configured to generate a first potential that is essentially proportional to the first power supply potential at a first node, the voltage detector circuit further configured to provide a first voltage window signal and a second voltage window signal by comparing the first potential to a first reference potential and a second reference potential, the first voltage window signal indicates a first voltage window in which the first power supply potential is located and the second voltage window signal indicates a second voltage window different from the first voltage window in which the first power supply potential is located;
an assist control circuit coupled to receive the first voltage window signal and the second voltage window signal and configured to provide at least one assist signal; and
at least one a static random access memory (SRAM) cell; wherein
the at least one assist signal alters a read operation or a write operation to the SRAM cell as compared to a read operation or write operation without the at least one assist signal.

2. The semiconductor device of claim 1, further including:
a voltage window latch circuit coupled to receive the first voltage window signal and the second voltage window signal and configured to provide a first latched voltage window signal and a second latched voltage window signal; and
the assist control circuit receives the first latched voltage window signal and the second voltage window signal.

3. The semiconductor device of claim 2, further including:
a voltage window change detector circuit coupled to receive the first voltage window signal and the second voltage window signal and configured to provide a voltage change detection signal in response to the first voltage window signal or the second voltage window signal changing from a first logic level to a second logic level.

4. The semiconductor device of claim 3, further including:
a latch control circuit coupled to receive the voltage change detection signal and configured to provide a voltage latch signal wherein
the voltage window latch circuit latches the first and second voltage window signals to provide the at least one latched voltage window signal in response to the voltage latch signal.

5. The semiconductor device of claim 4, wherein:
the latch control circuit is coupled to receive an active signal and configured to provide the voltage latch signal in response to the active signal indicating the semiconductor device is in a standby mode of operation.

6. The semiconductor device of claim 4, wherein:
the voltage latch signal is a pulse signal having a predetermined pulse width.

7. The semiconductor device of claim 6, wherein:
the latch control circuit includes a latch circuit, the latch circuit is configured to be set in response to the voltage change detection signal and reset in response to the voltage latch signal.

8. The semiconductor device of claim 1, wherein:
the at least one assist signal includes a read assist signal.

9. The semiconductor device of claim 8, further including
a word line voltage circuit coupled to receive the read assist signal and configured to provide a word line potential that is substantially less than the first power supply potential in response to the read assist signal; wherein
the SRAM cell is coupled to receive the word line potential at a gate terminal of an insulated gate field effect transistor (IGFET) during the read operation.

10. The semiconductor device of claim 9, wherein:
the read assist signal includes a first read assist signal logic level and a second read assist signal logic level; and
the word line voltage circuit is configured to provide the word line potential at a level that is substantially less than the first power supply potential when the read assist signal has the first read assist signal logic level and provide the word line potential at a level that is essentially the same potential as the first power supply potential when the read assist signal has the second read assist signal logic level.

11. The semiconductor device of claim 8, further including:
a sense amplifier circuit coupled to receive data from the SRAM cell during the read operation and provide a data output signal, the sense amplifier circuit includes
a threshold voltage compensation circuit configured to compensate for differences in threshold voltages in a first insulated gate field effect transistor (IGFET) and a second IGFET during the read operation of data; wherein
the threshold voltage compensation circuit is enabled in response to the read assist signal having a first read assist signal logic level and disabled in response to the read assist signal having a second read assist signal logic level.

12. The semiconductor device of claim 1, wherein:
the at least one assist signal includes a write assist signal.

13. The semiconductor device of claim 12, further including:
the SRAM cell is connected to at least a first bit line;
the first power supply potential provides an upper power rail to the semiconductor device and a reference potential provides a lower power rail to the semiconductor device;
a write voltage selection circuit coupled to receive the write assist signal and configured to provide a write potential that is substantially less than the reference potential when the write assist signal has a first write assist signal logic level and essentially the reference potential when the write assist signal has a second write assist signal logic level; and a write driver circuit coupled to receive the write potential and drive the at least first bit line to essentially to write potential during the write operation.

14. The semiconductor device of claim 12, further including:
a word line voltage circuit coupled to receive the write assist signal and configured to provide a word line potential that is substantially greater than the first power supply potential when the write assist signal has a first write assist signal logic level and essentially the first power supply potential when the write assist signal has a second write assist signal logic level; and
the SRAM cell is coupled to receive the word line potential at a gate terminal of an insulated gate field effect transistor (IGFET) during the write operation.

15. The semiconductor device of claim 12, further including;
an array cell voltage circuit coupled to receive the write assist signal and configured to provide a cell power supply potential that is substantially less than the first power supply potential when the first write assist signal has a first write assist signal logic level and essentially the first power supply potential when the write assist signal has a second write assist signal logic level; and
the SRAM cell is coupled to receive, and is powered by, the cell power supply potential.

16. The semiconductor device of claim 1, further including:
a temperature detector circuit configured to provide a first temperature window signal and a second temperature window signal, the first temperature window signal indicates a first predetermined temperature window in which the temperature of the semiconductor device is operating and the second temperature window signal indicates a second predetermined temperature window in which the semiconductor device is operating; wherein
the assist control circuit is coupled to receive the first temperature window signal and the second temperature window signal.

17. The semiconductor device of claim 16, further including:
a temperature window latch circuit coupled to receive the first temperature window signal and the second temperature window signal and configured to provide a first latched temperature window signal and a second latched temperature window; and
the assist control circuit receives the first latched temperature window signal and the second latched temperature window signal.

18. The semiconductor device of claim 16, further including:
a temperature window change detector circuit coupled to receive the first temperature window signal and the second temperature window signal and configured to provide a temperature change detection signal in response to the first temperature window signal or the second temperature window signal changing from a first logic level to a second logic level.

19. The semiconductor device of claim 1 wherein:
the semiconductor device includes a processor circuit portion and an SRAM circuit portion, the processor circuit portion and the SRAM circuit portion are commonly powered by the first power supply potential, the SRAM circuit portion includes the at least one SRAM cell.

20. The semiconductor device of claim 19, wherein:
the processor circuit portion and the SRAM circuit portion are connected by a bus for transferring data between the processor circuit portion and the SRAM circuit portion.

* * * * *